(12) United States Patent
Kato et al.

(10) Patent No.: US 10,170,934 B2
(45) Date of Patent: Jan. 1, 2019

(54) ELECTROMAGNETIC-COUPLING-MODULE-ATTACHED ARTICLE

(71) Applicant: Murata Manufacturing Co., Ltd., Nagaokakyo-shi, Kyoto-fu (JP)

(72) Inventors: Noboru Kato, Moriyama (JP); Ikuhei Kimura, Nara (JP); Kimikazu Iwasaki, Aichi-gun (JP); Satoshi Ishino, Kusatsu (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 256 days.

(21) Appl. No.: 14/838,417

(22) Filed: Aug. 28, 2015

(65) Prior Publication Data

US 2015/0372504 A1    Dec. 24, 2015

Related U.S. Application Data

(63) Continuation of application No. 13/754,972, filed on Jan. 31, 2013, now Pat. No. 9,165,239, which is a continuation of application No. 11/740,509, filed on Apr. 26, 2007, now Pat. No. 9,064,198.

(60) Provisional application No. 60/746,433, filed on May 4, 2006, provisional application No. 60/823,002, filed on Aug. 21, 2006.

(30) Foreign Application Priority Data

| Apr. 26, 2006 | (JP) | 2006-122487 |
| Jun. 30, 2006 | (JP) | 2006-182686 |
| Dec. 25, 2006 | (JP) | 2006-347460 |

(51) Int. Cl.
*H02J 5/00* (2016.01)
*H02J 50/12* (2016.01)
*G06K 19/077* (2006.01)
*H02J 17/00* (2006.01)

(52) U.S. Cl.
CPC ........ *H02J 50/12* (2016.02); *G06K 19/07749* (2013.01); *G06K 19/07771* (2013.01); *G06K 19/07773* (2013.01); *H02J 17/00* (2013.01); *H01L 2224/16227* (2013.01)

(58) Field of Classification Search
CPC ....... G06K 19/07779; G06K 19/07749; G06K 19/07771; G06K 19/07773
See application file for complete search history.

(56) References Cited

U.S. PATENT DOCUMENTS

| 6,130,612 | A | * | 10/2000 | Castellano | ......... | G06K 19/0723 |
| | | | | | | 340/572.2 |
| 2004/0095277 | A1 | * | 5/2004 | Mohamadi | ............... | H01Q 1/38 |
| | | | | | | 343/700 MS |
| 2008/0191028 | A1 | * | 8/2008 | Kagaya | ............ | G06K 19/07749 |
| | | | | | | 235/492 |

OTHER PUBLICATIONS

Kato et al., "Electromagnetic-Coupling-Module-Attached Article", U.S. Appl. No. 13/754,972, filed Jan. 31, 2013.

* cited by examiner

*Primary Examiner* — Hongmin Fan
(74) *Attorney, Agent, or Firm* — Keating & Bennett, LLP

(57) ABSTRACT

An electromagnetic-coupling module including a radio IC chip and a feeder circuit board on which the radio IC chip is mounted and a feeder circuit including a resonant circuit having a predetermined resonant frequency is attached to an article. The article has a radiation element that radiates a transmission signal supplied from the feeder circuit of the electromagnetic-coupling module via electromagnetic coupling and that supplies a received reception signal to the feeder circuit via the electromagnetic coupling.

5 Claims, 61 Drawing Sheets

ELECTROMAGNETIC-COUPLING-MODULE-ATTACHED ARTICLE

BACKGROUND OF THE INVENTION

1. Field of the Invention

The present invention relates to electromagnetic-coupling-module-attached articles, and more specifically, to an electromagnetic-coupling-module-attached article including a radio IC chip used in an RFID (Radio Frequency Identification) system.

2. Description of the Related Art

Recently, RFID systems, in which a reader/writer that generates an induction field and an IC tag (hereinafter, referred to as a radio IC device) storing predetermined information attached to an article communicate with each other in a non-contact manner to transmit information, have been developed as article management systems. Known radio IC devices used in the RFID systems, for example, are described in Japanese Unexamined Patent Application Publication No. 2005-136528 (Patent Document 1) and Japanese Unexamined Patent Application Publication No. 2005-244778 (Patent Document 2).

More specifically, as shown in FIG. 60, a radio IC device, in which an antenna element 601 is disposed on a plastic film 600 and a radio IC chip 610 is attached to one end of the antenna element 601, is provided. As shown in FIG. 61, a radio IC device, in which an antenna element 621 and radiation electrodes 622 are disposed on a plastic film 620 and a radio IC chip 610 is attached at a predetermined position of the antenna element 621, is provided.

However, in conventional radio IC devices, the radio IC chip 610 is DC-connected to and mounted on the antenna element 601 or 621 using Au bumps. Accordingly, positioning of the minute radio IC chip 610 on the large film 600 or 620 is required. Nevertheless, accurately positioning the minute radio IC chip 610 on the large film 600 or 620 is extremely difficult. The conventional radio IC devices have a problem that a resonant frequency characteristic at an antenna changes if the positioning thereof shifts during mounting. In addition, the resonant frequency characteristic at the antenna changes if the antenna element 601 or 621 is rolled or sandwiched between dielectrics (e.g., inserted inside a book).

Although applications for radio IC devices are virtually limitless, attaching the radio IC devices to various articles is difficult since the resonant frequency characteristic changes due to an arrangement state of antennas or other factors.

SUMMARY OF THE INVENTION

To overcome the problems described above, preferred embodiments of the present invention provide an electromagnetic-coupling-module-attached article including an electromagnetic-coupling module having a radio IC chip a stable frequency characteristic.

In an electromagnetic-coupling-module-attached article according to preferred embodiments of the present invention, an electromagnetic-coupling module defined by a radio IC chip and a feeder circuit board on which the radio IC chip is mounted and a feeder circuit including a resonant circuit having a predetermined resonant frequency is provided, is attached to an article. The electromagnetic-coupling-module-attached article includes a radiation element that radiates a transmission signal supplied from the feeder circuit of the electromagnetic-coupling module via electromagnetic coupling and/or supplies a received reception signal to the feeder circuit via the electromagnetic coupling.

In the electromagnetic-coupling-module-attached article according to preferred embodiments of the present invention, the radio IC chip is mounted on the feeder circuit board and is integrated with the radiation element through the feeder circuit board. Since the size of the feeder circuit board is significantly smaller than the radiation element, it is possible to mount the radio IC chip on the feeder circuit board extremely accurately.

Additionally, a frequency of a transmission signal radiated from the radiation element and a frequency of a reception signal supplied to the radio IC chip are determined primarily by a resonant frequency of the resonant circuit in the feeder circuit board. The frequencies are determined primarily because the frequencies slightly shift due to a positional relationship between the feeder circuit board and the radiation element. That is, since the frequencies of the transmission and reception signals are determined in the feeder circuit board on which the radio IC chip is highly accurately mounted, the frequency characteristic does not change regardless of the shape, size, and position of the radiation element, for example, even if the radiation element is rolled or sandwiched by dielectrics, and thus, a stable frequency characteristic is obtained. Accordingly, various kinds of articles can be incorporated in an RFID system.

In the electromagnetic-coupling-module-attached article according to preferred embodiments of the present invention, the radiation element may be a metal material that the article itself originally includes. For example, when a bicycle is the article, a metal body thereof can be used as the radiation element. When a mobile terminal device is the article, a metal housing can be used as the radiation element. In addition, the radiation element may be a metal pattern applied to the article for use as the radiation element. For example, when clothing contained in wrapping paper is the article, a metal film pattern may be provided on the wrapping paper and this metal film pattern may be used as the radiation element.

In the electromagnetic-coupling-module-attached article according to preferred embodiments of the present invention, the radiation element may be a dielectric. Here, the dielectric denotes a material whose dielectric constant is equal to or greater than about 1. By adjusting the characteristic impedance at an input and output portion of the electromagnetic-coupling module and characteristic impedance at a dielectric interface, an electromagnetic wave is input into the dielectric and the dielectric functions as an electromagnetic radiator. That is, ceramic, glass and resin dielectrics, such as a plastic bottle, can function as an antenna, which is generally made of metal. The dielectric functions as the radiation element, whereby various kinds of articles can be incorporated in an RFID system.

The radio IC chip not only stores information about articles to which the electromagnetic-coupling module is attached but also can rewrite the information, and may have information processing functions other than those of an RFID system.

Additionally, in the electromagnetic-coupling-module-attached article according to preferred embodiments of the present invention, the resonant circuit may preferably be a lumped-constant resonant circuit defined by a capacitor pattern and an inductor pattern. The lumped-constant resonant circuit may be an LC series resonant circuit or an LC parallel resonant circuit. Alternatively, the lumped-constant resonant circuit may include a plurality of LC series resonant circuits or a plurality of LC parallel resonant circuits.

It is possible to define the resonant circuit by a distributed-constant resonant circuit. In such a case, an inductor of the resonant circuit is preferably defined by a stripline or other suitable component. However, if the resonant circuit is defined by a lumped-constant resonant circuit including a capacitor pattern and an inductor pattern, miniaturization can be readily achieved and the resonant circuit is less affected by other elements, such as the radiation element. If the resonant circuit is defined by a plurality of resonant circuits, the band of the transmission signal is widened since each of the resonant circuits are coupled.

In addition, if the capacitor pattern is disposed downstream of the radio IC chip and between the radio IC chip and the inductor pattern, a surge withstand capability is improved. Because the surge is a low-frequency current up to about 200 MHz, it is possible to cut the surge by the capacitor and to prevent the radio IC chip from being destroyed by the surge.

The feeder circuit board may be a multi-layer board defined by laminating a plurality of dielectric layers or magnetic layers. In this case, the capacitor pattern and the inductor pattern are provided on a surface of and/or inside the multi-layer board. By defining the resonant circuit by the multi-layer board, elements (e.g., electrode patterns or other elements) defining the resonant circuit can be provided not only on the surface of the board but also inside the board and miniaturization of the board can be achieved. In addition, the layout flexibility of the resonant circuit elements and performance of the resonant circuit increase. The multi-layer board may be a resin multi-layer board obtained by laminating a plurality of resin layers or a ceramic multi-layer board obtained by laminating a plurality of ceramic layers. Additionally, the multi-layer board may be a thin-film multi-layer board utilizing a thin film coating technology. If the multi-layer board is the ceramic multi-layer board, it is preferable to form the ceramic layers with a low-temperature sintering ceramic material, such that silver and copper having low resistance can be used as resonant circuit members.

On the other hand, the feeder circuit board may be a dielectric or magnetic single-layer board. In this case, the capacitor pattern and/or the inductor pattern are provided on a surface of the single-layer board. The material of the single-layer board may be resin or ceramic. Capacitance of the capacitor pattern may be provided between planar electrodes disposed on front and back surfaces of the single-layer board. Alternatively, the capacitance may be provided between electrodes arranged in parallel on one surface of the single-layer board.

Preferably, the feeder circuit board is a rigid board made of resin or ceramic. If the board is rigid, the frequency of the transmission signal is stable even when the radio IC device is adhered to articles having any shape. In addition, the radio IC chip can be mounted stably on the rigid board.

Meanwhile, it is preferable that an electrical length of the radiation element is an integral multiple of a half wavelength of the resonant frequency, such that a gain is maximized. However, since the frequency is substantially determined in the resonant circuit, the electrical length of the radiation element is not necessarily an integral multiple of a half wavelength of the resonant frequency. This is advantageous as compared to a case in which the radiation element is an antenna element having a specific resonant frequency.

Additionally, various configurations can be used for connection between the radio IC chip and the feeder circuit board. For example, a chip-side electrode pattern is provided in the radio IC chip and a first board-side electrode pattern is provided in the feeder circuit board, and the chip-side electrode pattern and the first board-side electrode pattern may be DC-connected. In this case, the radio IC chip and the feeder circuit board can be connected with solder, conductive resin, Au bumps, or other suitable material.

Alternatively, the chip-side electrode pattern and the first board-side electrode pattern may be connected by capacitive coupling or magnetic coupling. If connection is made by capacitive coupling or magnetic coupling, solder and conductive resin is not required and the radio IC chip may be adhered using adhesive, such as resin. In this case, the chip-side electrode pattern and the first board-side electrode pattern are not necessarily provided on the surface of the radio IC chip and the surface of the feeder circuit board. For example, a resin film is provided on the surface of the chip-side electrode pattern or the first board-side electrode pattern may be provided in an inner layer of the multi-layer board.

With capacitive coupling, it is preferable that the size of the first board-side electrode pattern is greater than that of the chip-side electrode pattern. Even if the accuracy of position at the time the radio IC chip is mounted on the feeder circuit board varies to some extent, variation of capacitance produced between both electrode patterns is reduced. Furthermore, although forming a large electrode pattern on a small radio IC chip is difficult, forming a large electrode pattern is not difficult since the feeder circuit board is relatively large.

With magnetic coupling, since a significantly high mounting accuracy of a radio IC chip on a feeder circuit board is not required as compared to capacitive coupling, mounting is facilitated. In addition, it is preferable that each of the chip-side electrode pattern and the first board-side electrode pattern be a coil-shaped electrode pattern. If the coil-shaped electrode pattern is a spiral or helical coil-shaped electrode pattern, the design is further facilitated. If the frequency is high, a meander pattern is effective.

On the other hand, various configurations can be used for connection between the feeder circuit board and the radiation element. For example, a second board-side electrode pattern and the radiation element may be connected by capacitive coupling or magnetic coupling. If connection is made by capacitive coupling or magnetic coupling, solder and conductive resin is not required and the feeder circuit board may be adhered using adhesive, such as resin. In this case, the second board-side electrode pattern is not necessarily provided on the surface of the feeder circuit board. For example, the second board-side electrode pattern may be provided in an inner layer of the multi-layer board.

With magnetic coupling, preferably, the second board-side electrode pattern is a coil-shaped electrode pattern. Since it is easy to control magnetic flux with a spiral or helical coil-shaped electrode pattern, the design is facilitated. If the frequency is high, a meander pattern can be used. Additionally, with magnetic coupling, it is preferable that a change in magnetic flux caused in the second board-side electrode pattern (coil-shaped electrode pattern) is not prevented. For example, an opening is preferably provided at the radiation element, such that a signal energy transmission efficiency can be improved and a variation of frequency due to adhering the feeder circuit board and the radiation element is reduced.

According to preferred embodiments of the present invention, a radio IC chip can be mounted on a feeder circuit board extremely accurately. In addition, since frequencies of a transmission signal and a reception signal are determined in a feeder circuit provided in the feeder circuit board, a frequency characteristic does not change and stable frequency characteristics can be obtained if an electromagnetic-coupling module is combined with various forms of radiation element.

Accordingly, by utilizing metal materials that the articles themselves include or metal patterns applied to the articles as the radiation elements, various articles can be incorporated in an RFID system and asset management of the articles can be performed.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 28A is a bottom view and FIG. 28B is an enlarged sectional view.

DETAILED DESCRIPTION OF PREFERRED EMBODIMENTS

In the following, preferred embodiments of electromagnetic-coupling-module-attached articles according to the present invention will be described with reference to the accompanying drawings. The same numerals are used for common parts and portions of the various electromagnetic-coupling modules and various articles described below, and repetitions of description are omitted.

First Example of Electromagnetic-Coupling Module

Figure 1:
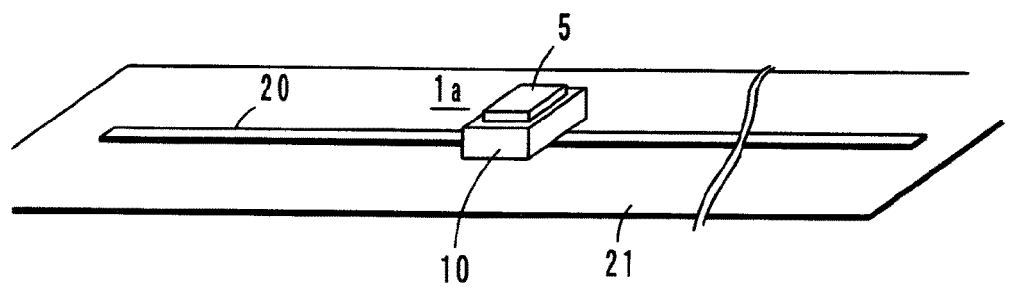
FIG. 1 is a perspective view showing a first example of an electromagnetic-coupling module.
Figure 2:
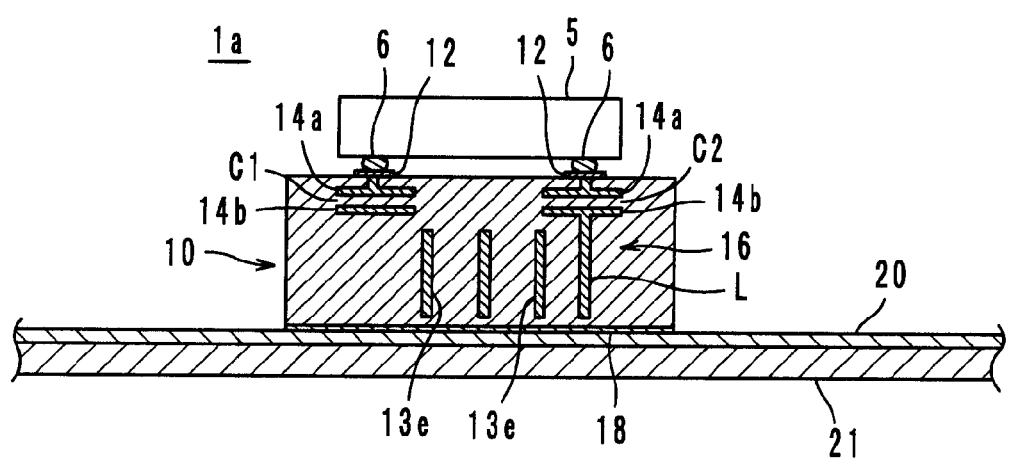
FIG. 2 is a sectional view of the first example.

An electromagnetic-coupling module 1a of a first example is combined with a monopole-type radiation element 20. As shown in FIG. 1 and FIG. 2, the electromagnetic-coupling module 1a includes a radio IC chip 5 and a feeder circuit board 10 on the upper surface of which the radio IC chip 5 is mounted. The electromagnetic-coupling module 1a is adhered on the radiation element 20. The radio IC chip 5 includes a clock circuit, a logic circuit, and a memory circuit, and stores necessary information therein. The radio IC chip 5 is directly DC-connected to a feeder circuit 16 included in the feeder circuit board 10.

The feeder circuit 16 is a circuit arranged to supply a transmission signal having a predetermined frequency to the radiation element 20 and/or a circuit for selecting a reception signal having a predetermined frequency from signals received by the radiation element 20 and supplying the selected reception signal to the radio IC chip 5. The feeder circuit 16 has a resonant circuit that resonates at frequencies of the transmission and reception signals.

Figure 3:
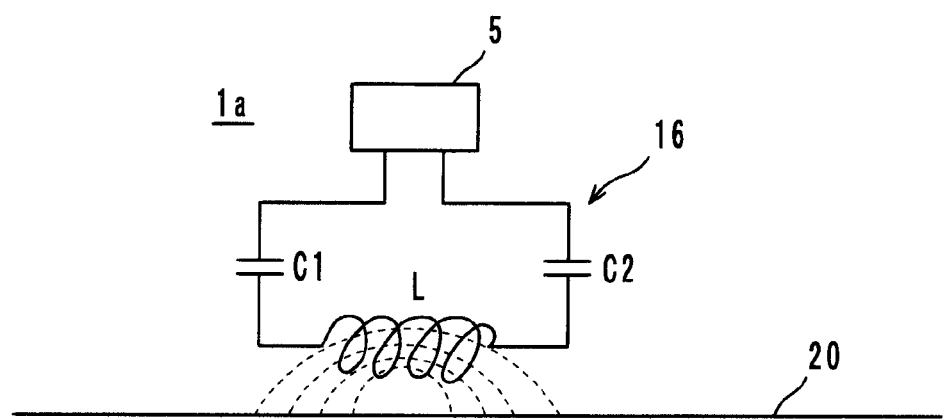
FIG. 3 is a diagram of an equivalent circuit of the first example.
Figure 4:
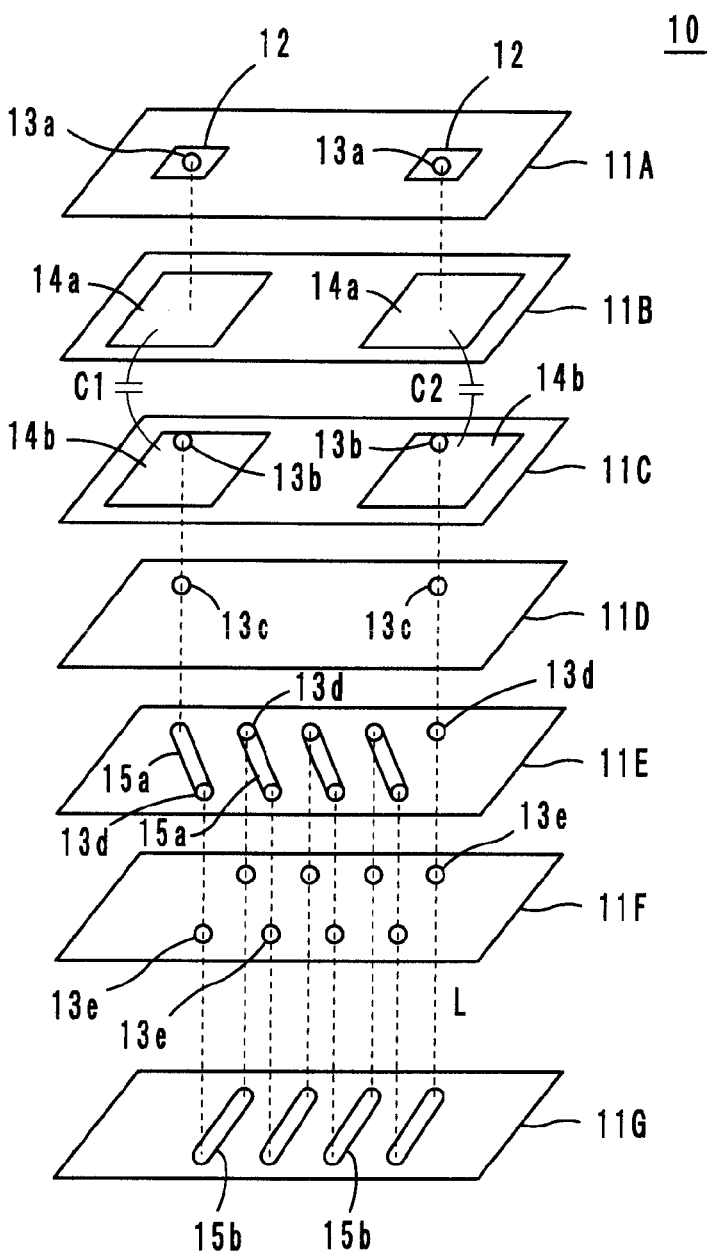
FIG. 4 is an exploded perspective view showing a feeder circuit board of the first example.

As shown in FIG. 2 and FIG. 3, the feeder circuit board 10 includes the feeder circuit 16, which is defined by a lumped-constant LC series resonant circuit including a helical inductance element L and capacitance elements C1 and C2. More specifically, as shown in FIG. 4, the feeder circuit board 10 is a board obtained by laminating, press-bonding, and burning ceramic sheets 11A to 11G made of dielectrics. The feeder circuit board 10 is defined by the sheet 11A on which connection electrodes 12 and via hole conductors 13a are provided, the sheet 11B on which capacitor electrodes 14a are provided, the sheet 11C on which capacitor electrodes 14b and via hole conductors 13b are provided, the sheet 11D on which via hole conductors 13c are provided, the sheet 11E on which conductive patterns 15a and via hole conductors 13d are provided, the sheet 11F (one or more) on which via hole conductors 13e are provided, and the sheet 11G on which conductive patterns 15b are provided. Meanwhile, each of the ceramic sheets 11A to 11G may be a sheet made of a magnetic ceramic material. The feeder circuit board 10 can be readily obtained with conventionally used multi-layer board manufacturing processes, such as a sheet laminating method and a thick film printing method.

By laminating the above-mentioned sheets 11A to 11G, the inductance element L whose axis of helix is substantially parallel to the radiation element 20 and the capacitance elements C1 and C2 are provided. In the capacitance elements C1 and C2, the capacitor electrodes 14b are connected to both ends of the inductance element L and the capacitor electrodes 14a are connected to the connection electrodes 12 through the via hole conductors 13a. The connection electrodes, which are board-side electrode patterns, are DC-connected to chip-side electrode patterns (not shown) in the radio IC chip 5 through solder bumps 6.

More specifically, transmission signals are fed to the radiation element 20 from the inductance element L, i.e., a coil-shaped electrode pattern, among elements constituting the feeder circuit via a magnetic field. In addition, reception signals from the radiation element 20 are fed to the inductance element L via a magnetic field. Accordingly, it is preferable to arrange the inductance element, among the inductance element and the capacitance elements defining the resonant circuit, near the radiation element 20 in the feeder circuit board 10.

In this example, the radiation element 20 is preferably made of a long non-magnetic material, such as aluminum foil and copper foil, namely, an open-ended metal material. The radiation element 20 is disposed on an article using an insulating flexible resin film 21, such as PET, as its foundation. A lower surface of the feeder circuit board 10 is adhered on the radiation element 20 through an insulating adhesion layer defined by adhesive 18.

To give an example of size, the thickness of the radio IC chip 5 is about 50 μm to about 100 μm. The thickness of the solder bump 6 is about 20 μm. The thickness of the feeder circuit board 10 is about 200 μm to about 500 μm. The thickness of the adhesive 18 is about 0.1 μm to μm 10 μm. The thickness of the radiation element 20 is about 1 μm to about 50 μm. The thickness of the film 21 is about 10 μm to about 100 μm. Additionally, the size (area) of the radio IC chip 5 may be various sizes, such as approximately 0.4 mm×0.4 mm and 0.9 mm×0.8 mm. The size (area) of the feeder circuit board 10 can range from the same size as that of the radio IC chip 5 to the size of approximately 3 mm×3 mm.

Figure 5A:
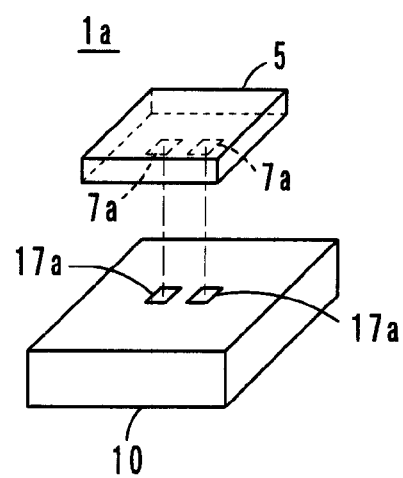
FIGS. 5A and 5B are perspective views showing connection state of a radio IC chip and a feeder circuit board.
Figure 5B:
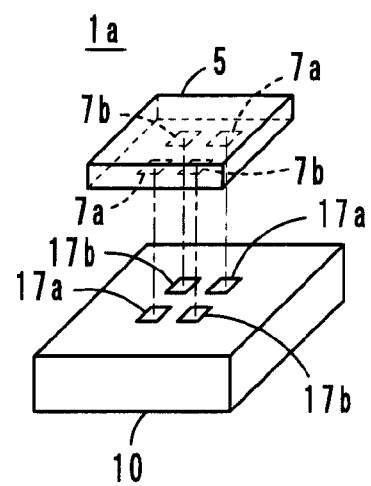

Connection configurations of the radio IC chip 5 and the feeder circuit board 10 are shown in FIGS. 5A and 5B. FIG. 5A is a configuration in which pairs of antenna (balance) terminals 7a and 17a are provided on the back surface of the radio IC chip 5 and on the front surface of the feeder circuit board 10, respectively. FIG. 5B shows another connection configuration. In addition to the pairs of antenna (balance) terminals 7a and 17a, ground terminals 7b and 17b are provided on the back surface of the radio IC chip 5 and on the front surface of the feeder circuit board 10, respectively. However, the ground terminals 17b of the feeder circuit board 10 are terminated and are not connected to other elements in the feeder circuit board 10.

An equivalent circuit of the electromagnetic-coupling module 1a is shown in FIG. 3. This electromagnetic-coupling module 1a receives a high-frequency signal (e.g., UHF frequency band) radiated from a reader/writer, not shown, with the radiation element 20. The electromagnetic-coupling module 1a resonates the feeder circuit 16 (an LC series resonant circuit defined by the inductance element L and the capacitance elements C1 and C2) that is primarily magnetically coupled to the radiation element 20, and supplies only the reception signal having a predetermined frequency band to the radio IC chip 5. On the other hand, the electromagnetic-coupling module 1a derives a predetermined energy from this reception signal. The electromagnetic-coupling module 1a applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 from the inductance element L in the feeder circuit 16 via the magnetic coupling. The transmission signal is transmitted and transferred to the reader/writer from the radiation element 20.

Meanwhile, although the coupling between the feeder circuit 16 and the radiation element 20 is primarily coupling via a magnetic field, coupling via an electric field may exist. In the present invention, "electromagnetic coupling" means coupling via an electric field and/or a magnetic field.

In the electromagnetic-coupling module 1a of the first example, the radio IC chip 5 is directly DC-connected on the feeder circuit board 10 including the feeder circuit 16 therein. The feeder circuit board 10 is approximately the same size as the radio IC chip 5, and is rigid. Thus, it is possible to align and mount the radio IC chip 5 extremely accurately as compared to mounting the radio IC chip on a large flexible film as with the conventional device. Furthermore, the feeder circuit board 10 is made of a ceramic material and has a heat resistance property. Thus, the radio IC chip 5 can be fixed on the feeder circuit board 10 with solder. That is, since an ultrasonic bonding method is not used, unlike the conventional method, the cost is reduced, and the radio IC chip 5 is not damaged by pressure applied at the time of the ultrasonic bonding, and a self-alignment effect resulting from reflow soldering is utilized.

In addition, in the feeder circuit 16, a resonant frequency characteristic is determined in the resonant circuit defined by the inductance element L and the capacitance elements C1 and C2. The resonant frequency of the signal radiated from the radiation element 20 is substantially equal to a self-resonance frequency of the feeder circuit 16. The maximum gain of the signal is substantially determined by at least one of size and shape of the feeder circuit 16 and distance and medium between the feeder circuit 16 and the radiation element 20. More specifically, in the first example, an electrical length of the radiation element 20 is set to a half wavelength $\lambda/2$ of the resonant frequency. However, the electrical length of the radiation element 20 does not have to be an integral multiple of $\lambda/2$. That is, in the present invention, the frequency of the signal radiated from the radiation element 20 is substantially determined by the resonant frequency of the resonant circuit (the feeder circuit 16). Thus, the frequency characteristic does not substantially depend on the electrical length of the radiation element 20.

It is preferable that the electrical length of the radiation element 20 is an integral multiple of $\lambda/2$, since the gain achieves a maximum value at such electrical lengths.

As described above, the resonant frequency characteristic of the feeder circuit 16 is determined in the resonant circuit, defined by the inductance element L and the capacitance elements C1 and C2, included in the feeder circuit board 10. Accordingly, the resonant frequency characteristic does not change even if the electromagnetic-coupling module 1a is inserted in a book. Additionally, the resonant frequency characteristic does not change even if the electromagnetic-coupling module 1a is rolled, such that the shape of the radiation element 20 is changed or the size of the radiation element 20 is changed. In addition, since the coil-shaped electrode pattern that defines the inductance element L is arranged such that the helical axis thereof is substantially parallel to the radiation element 20, the electromagnetic-coupling module 1a has an advantage that the center frequency does not vary. Furthermore, the capacitance elements C1 and C2 are inserted downstream of the radio IC chip 5. Thus, it is possible to cut low-frequency surge with these elements C1 and C2 and to protect the radio IC chip 5 from the surge.

Moreover, since the feeder circuit board 10 is a rigid multi-layer board, it is convenient to handle the radio IC chip 5 at the time of soldering. Additionally, the radiation element 20 is preferably made of a flexible metal film. Accordingly, for example, the radiation element 20 can be formed on a film used for wrapping clothing and on a surface of a generally cylindrical body, such as a plastic bottle, without difficulty.

In addition, in various preferred embodiments of the present invention, the resonant circuit may also function as a matching circuit for matching the impedance of the radio IC chip and the impedance of the radiation element. Alternatively, the feeder circuit board may further include a matching circuit, defined by an inductance element and a capacitance element, provided separately from the resonant circuit. If the function of the matching circuit is added to the resonant circuit, design of the resonant circuit tends to be complicated. If the matching circuit is provided separately from the resonant circuit, it is possible to independently design the resonant circuit and the matching circuit.

Second Example of Electromagnetic-Coupling Module

Figure 6:
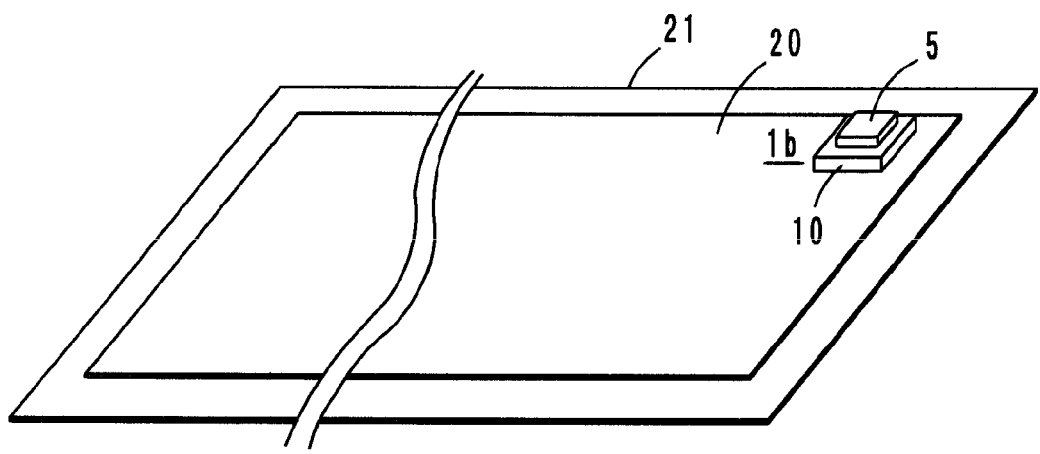
FIG. 6 is a perspective view showing a second example of an electromagnetic-coupling module.

As shown in FIG. 6, an electromagnetic-coupling module 1b of a second example is attached on a radiation element 20 made of aluminum foil or other suitable material having a large area on an article that includes a large insulating flexible plastic film 21 as its foundation. A feeder circuit board having a radio IC chip 5 mounted thereon is adhered at a desired position on the radiation element 20.

Meanwhile, a configuration of the electromagnetic-coupling module 1b, namely, an internal configuration of the feeder circuit board 10, is substantially the same as that of the first example. Accordingly, advantages of the second example are the same as those of the first example. Furthermore, this example has an advantage in that significantly high accuracy is not required for the adhesion position of the feeder circuit board 10.

Third Example of Electromagnetic-Coupling Module

Figure 7:
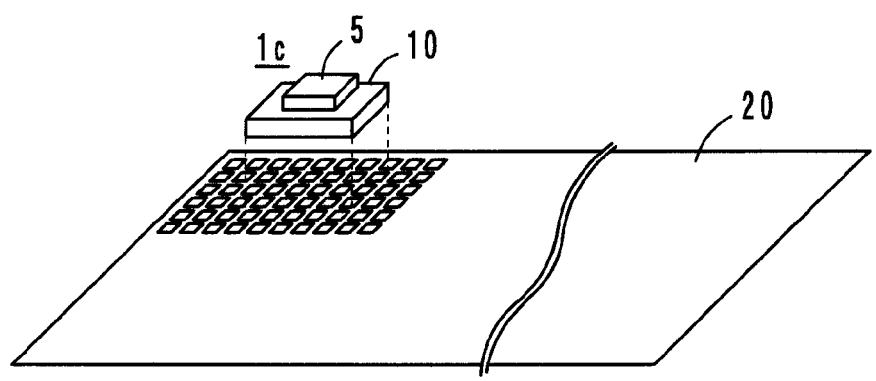
FIG. 7 is a perspective view showing a third example of an electromagnetic-coupling module.

As shown in FIG. 7, an electromagnetic-coupling module 1c of a third example is attached on a meshed portion of a large radiation element 20 made of aluminum foil or other suitable material. The mesh may be provided over all of the radiation element 20 or may be provided partially over the radiation element 20.

A configuration of the electromagnetic-coupling module is the same as that of the second example. In addition to an advantage that high accuracy is not required for the adhesion position of a feeder circuit board 10, variation (reduction) of magnetic flux generated from the feeder circuit board 10 is decreased since the magnetic flux of a coil-shaped electrode pattern passes through openings of the mesh and more magnetic flux can pass the radiation element 20. Accordingly, it is possible not only to improve signal energy transmission efficiency, but also to reduce a shift of frequency due to laminating.

Fourth Example of Electromagnetic-Coupling Module

Figure 8:
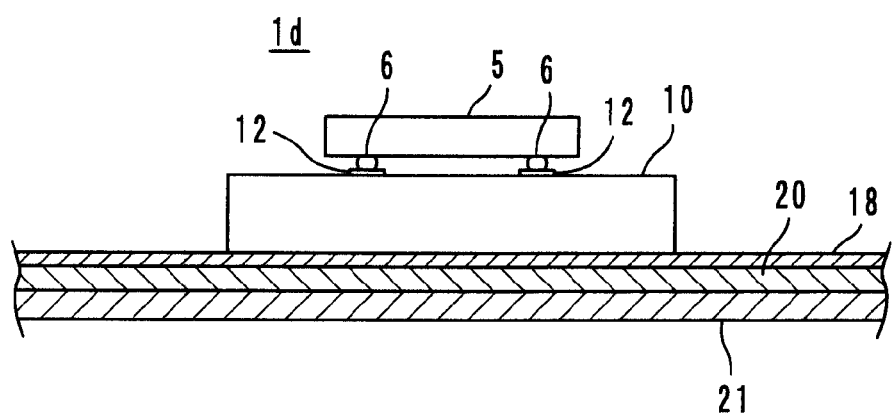
FIG. 8 is a sectional view showing a fourth example of an electromagnetic-coupling module.

As shown in FIG. 8, in an electromagnetic-coupling module 1d of a fourth example, adhesive 18 is applied to a surface, other than a conjunction surface to a feeder circuit board 10 but including the conjunction surface (herein, the whole surface) on an article that uses a film 21 as its foundation through a radiation element 20. By this adhesive 18, the article having the electromagnetic-coupling module 1d can be adhered to another article so that the electromagnetic-coupling module 1d is inside.

In addition, a configuration of the electromagnetic-coupling module 1d, namely, an internal configuration of the feeder circuit board 10, is the same as that of the first example. Accordingly, the advantages of the fourth example are substantially the same as those of the first example.

Fifth Example of Electromagnetic-Coupling Module

Figure 9:
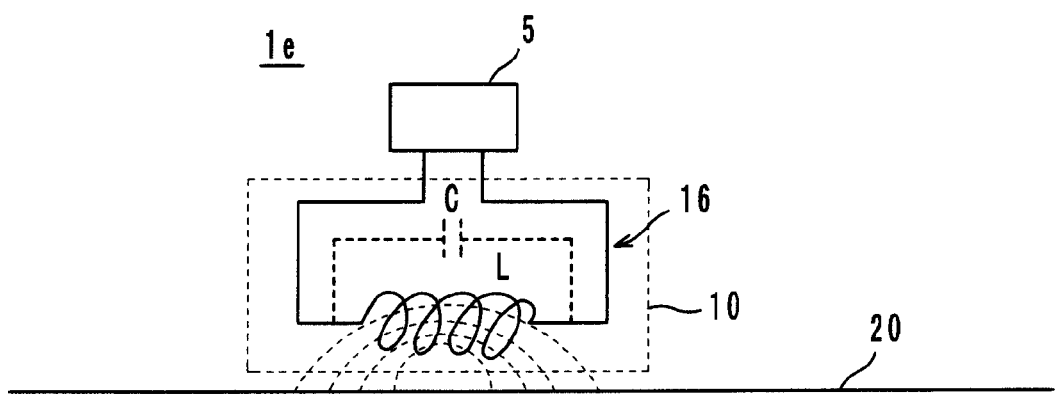
FIG. 9 is a diagram of an equivalent circuit showing a fifth example of an electromagnetic-coupling module.

As shown as an equivalent circuit in FIG. 9, an electromagnetic-coupling module 1e of a fifth example includes an inductance element L defined by a coil-shaped electrode pattern as a feeder circuit 16 in a feeder circuit board 10. A capacitance element C defining an LC parallel resonant circuit is provided as a stray capacitance (distributed-constant capacitance) between conductive patterns of the inductance element L.

That is, if the coil-shaped electrode pattern has self-resonance, even one coil-shaped electrode pattern can function as an LC parallel resonant circuit using an L-component of a coil-shaped electrode pattern itself and a C-component of stray capacitance between wires to define the feeder circuit 16. Accordingly, this electromagnetic-coupling module 1e receives a high-frequency signal (e.g., UHF frequency band) radiated from a reader/writer, not shown, with the radiation element 20. The electromagnetic-coupling module 1e resonates the feeder circuit 16 (an LC parallel resonant circuit defined by the inductance element L and the capacitance element C) that is primarily magnetically coupled to the radiation element 20, and supplies only a reception signal at a predetermined frequency band to a radio IC chip 5. On the other hand, the electromagnetic-coupling module 1e derives a predetermined energy from this reception signal. The electromagnetic-coupling module 1e applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 from the inductance element L in the feeder circuit 16 via magnetic coupling. The transmission signal is transmitted and transferred to the reader/writer from the radiation element 20.

Sixth Example of Electromagnetic-Coupling Module

Figure 10:
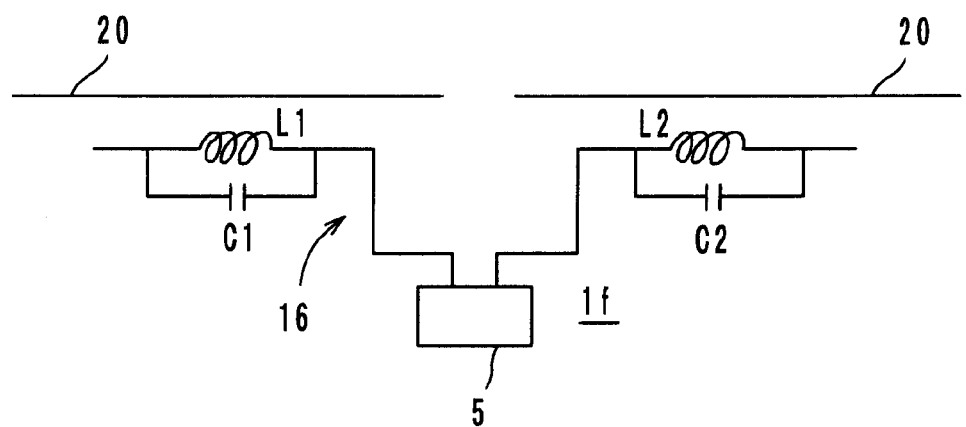
FIG. 10 is a diagram of an equivalent circuit showing a sixth example of an electromagnetic-coupling module.

As shown as an equivalent circuit in FIG. 10, an electromagnetic-coupling module 1f of a sixth example includes a feeder circuit 16 compatible with dipole-type radiation elements 20. A feeder circuit board includes the feeder circuit 16 that preferably includes two LC parallel resonant circuits. An inductance element L1 and a capacitance element C1 are connected to a first port side of a radio IC chip 5. An inductance element L2 and a capacitance element C2 are connected to a second port side of the radio IC chip 5. The pairs of the inductance element and capacitance element face the radiation elements 20 and 20, respectively. The ends of the inductance element L1 and the capacitance element C1 are open ends. Meanwhile, the first port and the second port constitute an I/O of a differential circuit.

Advantages of the sixth example are substantially the same as those of the first example. More specifically, this electromagnetic-coupling module 1f receives a high-frequency signal (e.g., UHF frequency band) radiated from a reader/writer, not shown, with the radiation elements 20. The electromagnetic-coupling module 1f resonates the feeder circuit 16 (an LC parallel resonant circuit defined by the inductance element L1 and the capacitance element C1 and an LC parallel resonant circuit defined by the inductance element L2 and the capacitance element C2) that is primarily magnetically coupled to the radiation elements 20, and supplies only a reception signal at a predetermined frequency band to the radio IC chip 5. On the other hand, the electromagnetic-coupling module 1f derives a predetermined energy from this reception signal. The electromagnetic-coupling module 1f applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation elements 20 from the inductance elements L1 and L2 in the feeder circuit 16 via the magnetic coupling. The transmission signal is transmitted and transferred to the reader/writer from the radiation elements 20.

Seventh Example of Electromagnetic-Coupling Module

Figure 11:
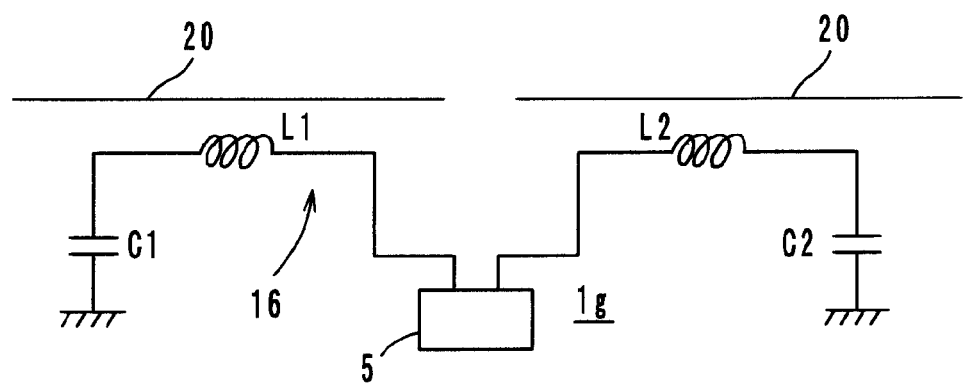
FIG. 11 is a diagram of an equivalent circuit showing a seventh example of an electromagnetic-coupling module.

As shown as an equivalent circuit in FIG. 11, an electromagnetic-coupling module 1g of a seventh example includes a feeder circuit 16 compatible with dipole-type radiation elements 20. A feeder circuit board includes the feeder circuit 16 including two LC series resonant circuits. Inductance elements L1 and L2 face the radiation elements 20 and 20, respectively. Each of capacitance elements C1 and C2 is connected to ground.

Advantages of the seventh example are substantially the same as those of the first example. More specifically, this electromagnetic-coupling module 1g receives a high-frequency signal (e.g., UHF frequency band) radiated from a reader/writer, not shown, with the radiation elements 20. The electromagnetic-coupling module 1g resonates the feeder circuit 16 (an LC series resonant circuit defined by the inductance element L1 and the capacitance element C1 and an LC series resonant circuit defined by the inductance element L2 and the capacitance element C2) that is primarily magnetically coupled to the radiation elements 20, and supplies only a reception signal at a predetermined frequency band to a radio IC chip 5. On the other hand, the electromagnetic-coupling module 1g derives a predetermined energy from this reception signal. The electromagnetic-coupling module 1g applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation elements 20 from the inductance elements L1 and L2 in the feeder circuit 16 via the magnetic coupling. The transmission signal is transmitted and transferred to the reader/writer from the radiation elements 20.

Eighth Example of Electromagnetic-Coupling Module

Figure 12:
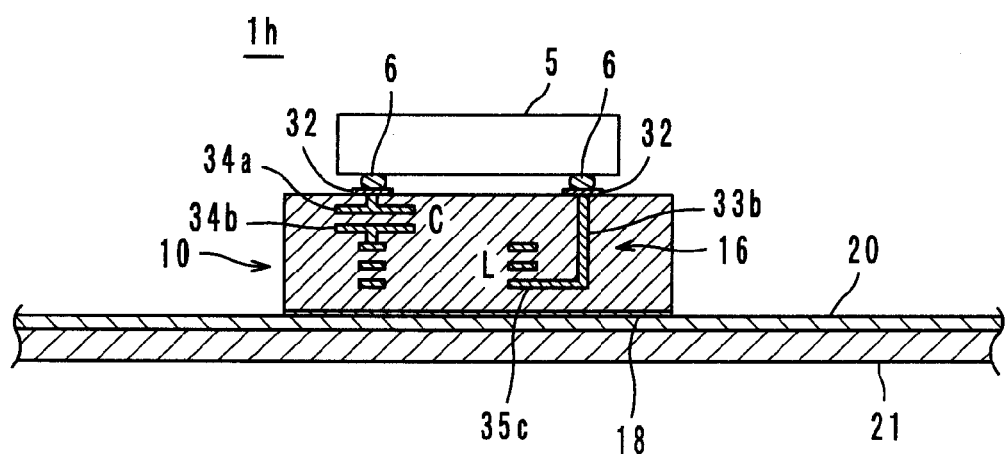
FIG. 12 is a sectional view showing an eighth example of an electromagnetic-coupling module.
Figure 13:
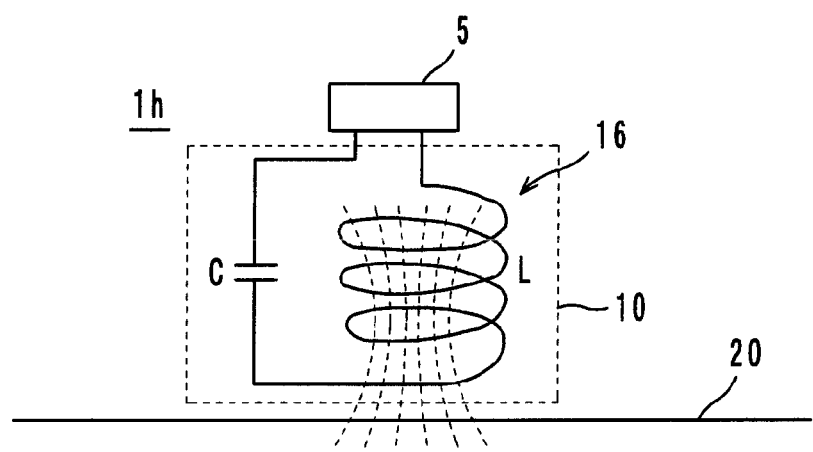
FIG. 13 is a diagram of an equivalent circuit of the eighth example.

As shown in FIG. 12, an electromagnetic-coupling module 1h of an eighth example is combined with a monopole-type radiation element 20. A feeder circuit 16 having an LC series resonant circuit includes an inductance element L and a capacitance element C included in a feeder circuit board 10. As shown in FIG. 13, an axis of a coil-shaped electrode pattern defining the inductance element L is arranged substantially perpendicular to the radiation element 20. The feeder circuit 16 is primarily magnetically coupled to the radiation element 20.

Figure 14:
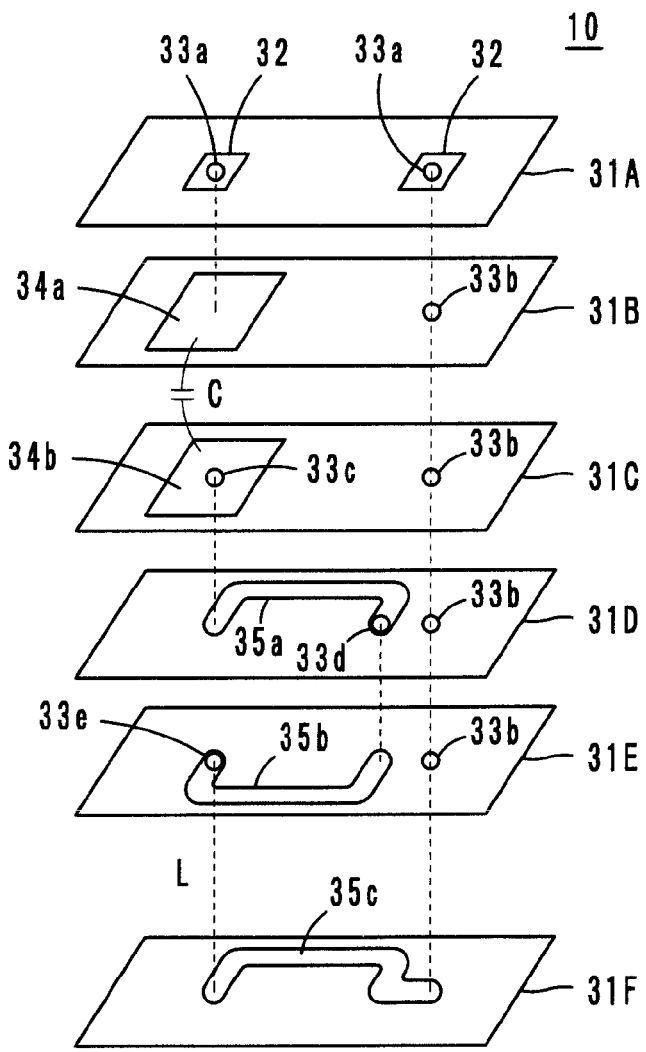
FIG. 14 is an exploded perspective view showing a feeder circuit board of the eighth example.

More specifically, as shown in FIG. 14, the feeder circuit board 10 is a board obtained by laminating, press-bonding, and burning ceramic sheets 31A to 31F made of dielectrics. The feeder circuit board 10 is defined by the sheet 31A on which connection electrodes 32 and via hole conductors 33a are provided, the sheet 31B on which a capacitor electrode 34a and a via hole conductor 33b are provided, the sheet 31C on which a capacitor electrode 34b and via hole conductors 33c and 33b are provided, the sheet 31D (one or more) on which a conductive pattern 35a and via hole conductors 33d and 33b are provided, the sheet 31E (one or more) on which a conductive pattern 35b and via hole conductors 33e and 33b are provided, and the sheet 31F on which a conductive pattern 35c is provided.

By laminating the above-described sheets 31A to 31F, the feeder circuit 16 having the LC series resonant circuit, in which the inductance element L whose axis of helix is substantially vertical to the radiation element 20 and the capacitance element C serially connected to the inductance element L are connected, is obtained. The capacitor electrode 34a is connected to the connection electrode 32 through the via hole conductor 33a, and is further connected to a radio IC chip 5 through solder bumps 6. One end of the inductance element L is connected to the connection electrode 32 through the via hole conductor 33b, and is further connected to the radio IC chip 5 through the solder bump 6.

Advantages of the eighth example are substantially the same as those of the first example. More specifically, this electromagnetic-coupling module 1h receives a high-frequency signal (e.g., UHF frequency band) radiated from a reader/writer, not shown, with the radiation element 20. The electromagnetic-coupling module 1h resonates the feeder circuit 16 (an LC series resonant circuit defined by the inductance element L and the capacitance element C) that is primarily magnetically coupled to the radiation element 20, and supplies only a reception signal at a predetermined frequency band to the radio IC chip 5. On the other hand, the electromagnetic-coupling module 1h derives a predetermined energy from this reception signal. The electromagnetic-coupling module 1h applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 from the inductance elements L in the feeder circuit 16 via magnetic coupling. The transmission signal is transmitted and transferred to the reader/writer from the radiation element 20.

In particular, in the eighth example, since the axis of the helix of the coil-shaped electrode pattern is arranged substantially vertical to the radiation element 20, the eighth example has an advantage that magnetic flux component to the radiation element 20 increases and a signal energy transmission efficiency is improved and gain is increased.

Ninth Example of Electromagnetic-Coupling Module

Figure 15:
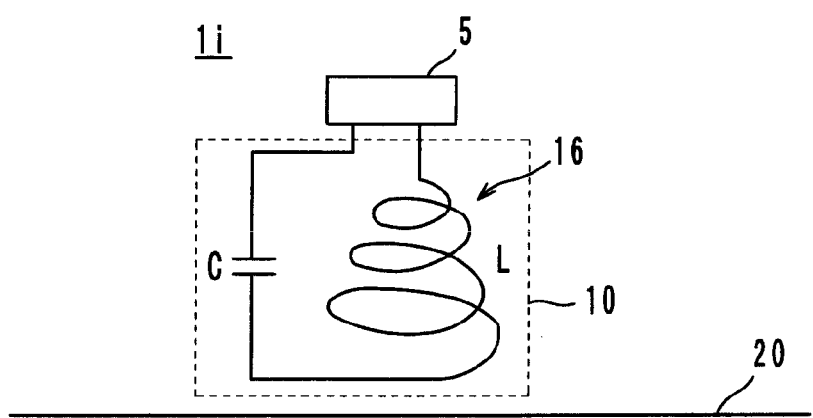
FIG. 15 is a diagram of an equivalent circuit showing a ninth example of an electromagnetic-coupling module.

As shown as an equivalent circuit in FIG. 15, in an electromagnetic-coupling module 1i of a ninth example, a width of the helix (a coil diameter) of a coil-shaped electrode pattern of an inductance element L shown in the above-described eighth example is gradually increased toward a radiation element 20. Other configurations are substantially the same as those of the eighth example.

The ninth example provides substantially the same advantages as those of the eighth example. In addition, since the width of the helix (coil diameter) of the coil-shaped electrode pattern of the inductance element L is gradually increased toward the radiation element 20, the signal transmission efficiency is improved.

Tenth Example of Electromagnetic-Coupling Module

Figure 16:
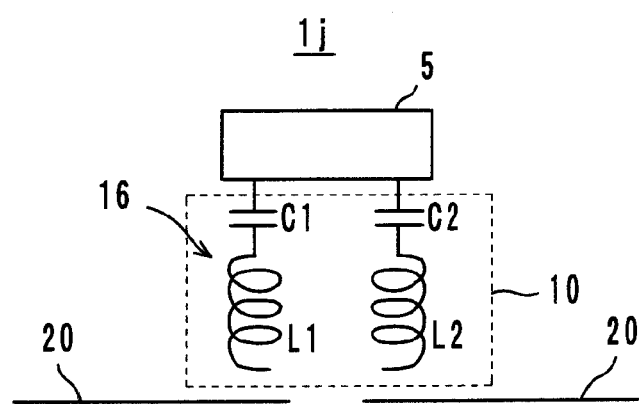
FIG. 16 is a diagram of an equivalent circuit showing a tenth example of an electromagnetic-coupling module.

As shown as an equivalent circuit in FIG. 16, an electromagnetic-coupling module 1j of a tenth example is compatible with dipole-type radiation elements 20. A feeder circuit board 10 includes a feeder circuit 16 defined by two LC series resonant circuits.

Figure 17:
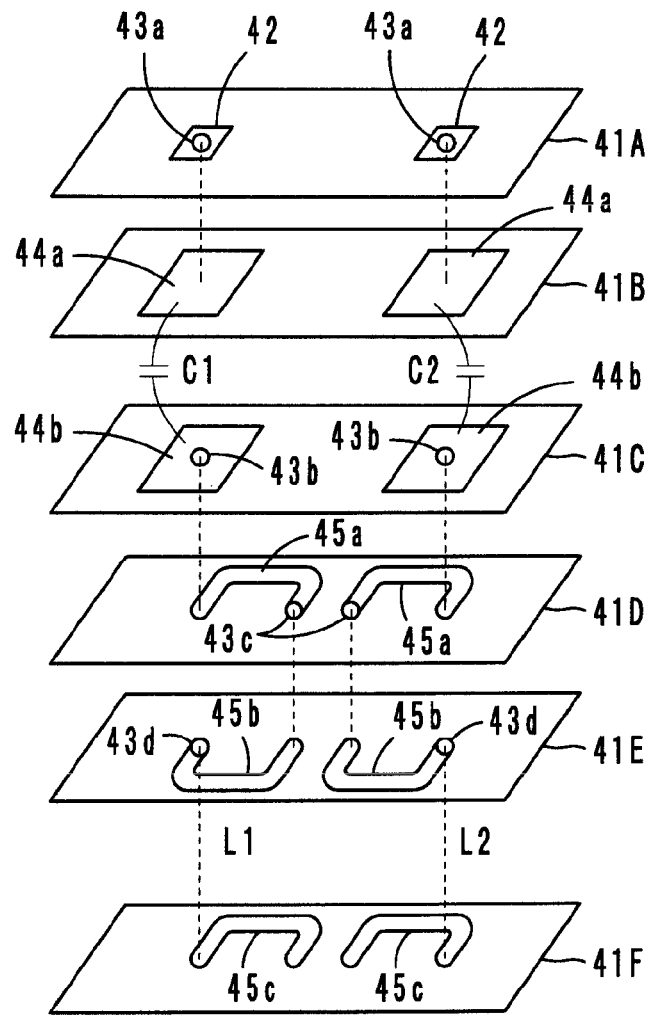
FIG. 17 is an exploded perspective view showing a feeder circuit board of the tenth example.

More specifically, as shown in FIG. 17, the feeder circuit board 10 is a board obtained by laminating, press-bonding, and burning ceramic sheets 41A to 41F made of dielectrics. The feeder circuit board 10 is defined by the sheet 41A on which connection electrodes 42 and via hole conductors 43a are provided, the sheet 41B on which capacitor electrodes 44a are provided, the sheet 41C on which capacitor electrodes 44b and via hole conductors 43b are provided, the sheet 41D (one or more) on which conductive patterns 45a and via hole conductors 43c are provided, the sheet 41E (one or more) on which conductive patterns 45b and via hole conductors 43d are provided, and the sheet 41F on which conductive patterns 45c are provided.

By laminating the sheets 41A to 41F, the feeder circuit 16, having two LC series resonant circuit in which inductance elements L1 and L2 whose helical axis is substantially perpendicular to the radiation elements 20 and the capacitance elements C1 and C2 serially connected to the inductance elements L1 and L2 are connected, is obtained. The capacitor electrodes 44a are connected to the connection electrodes 42 through the via hole conductors 43a, and are further connected to a radio IC chip 5 through solder bumps.

Advantages of the tenth example are substantially the same as those of the first example. More specifically, this electromagnetic-coupling module 1j receives a high-frequency signal (e.g., UHF frequency band) radiated from a reader/writer, not shown, with the radiation elements 20. The electromagnetic-coupling module 1j resonates the feeder circuit 16 (an LC series resonant circuit defined by the inductance element L1 and the capacitance element C1 and an LC series resonant circuit defined by the inductance element L2 and the capacitance element C2) that is primarily magnetically coupled to the radiation elements 20, and supplies only a reception signal at a predetermined frequency band to the radio IC chip 5. On the other hand, the electromagnetic-coupling module 1j derives a predetermined energy from this reception signal. The electromagnetic-coupling module 1j applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation elements 20 from the inductance elements L1 and L2 in the feeder circuit 16 via magnetic coupling. The transmission signal is transmitted and transferred to the reader/writer from the radiation elements 20.

In addition, the capacitance elements C1 and C2 are arranged downstream of the radio IC chip 5 and between the radio IC chip 5 and the inductance elements L1 and L2. Thus, the surge withstand capability is improved. Because the surge is a low-frequency current up to about 200 MHz, it is possible to cut the surge by the capacitance elements C1 and C2 and to prevent the radio IC chip 5 from being destroyed by the surge.

Meanwhile, in the tenth example, the resonant circuit including the capacitance element C1 and the inductance element L1 and the resonant circuit including the capacitance element C2 and the inductance element L2 are not connected to each other.

Eleventh Example of Electromagnetic-Coupling Module

Figure 18:
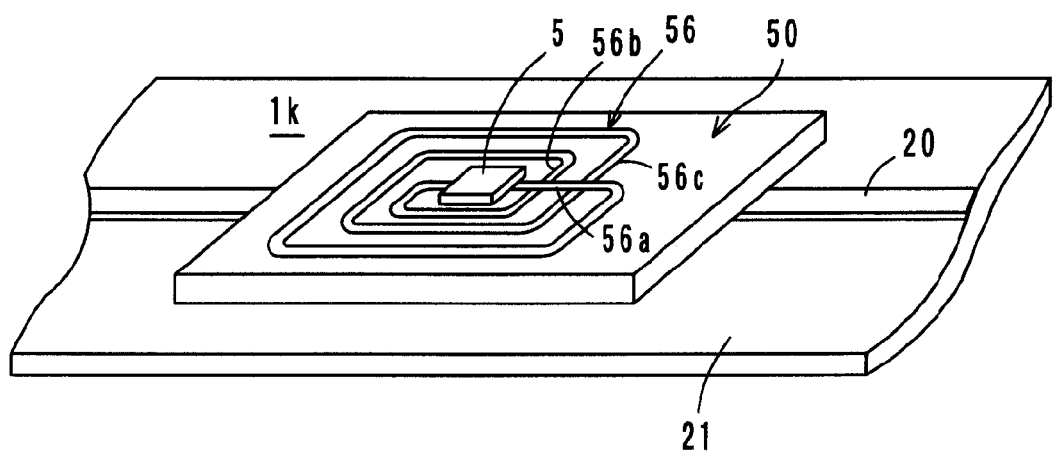
FIG. 18 is a perspective view showing an eleventh example of an electromagnetic-coupling module.

As shown in FIG. 18, in an electromagnetic-coupling module 1k of an eleventh example, a coil-shaped electrode pattern is provided on a surface of a rigid feeder circuit board 50 made of ceramic or heat-resistant resin. More specifically, a feeder circuit 56 including a spiral inductance element is provided on a single-layer board 50. Both ends of the feeder circuit 56 are directly connected to a radio IC chip 5 through solder bumps. The feeder circuit board 50 is adhered on a film 21, which carries a radiation element 20, preferably using adhesive. In addition, a conductive pattern 56a and conductive patterns 56b and 56c defining the feeder circuit 56 and intersecting with each other are separated by insulating films, not shown.

The feeder circuit 56 in the eleventh example defines an LC parallel resonant circuit that utilizes stray capacitance between the spiral conductive patterns defining a capacitance component. Additionally, the feeder circuit board 50 is preferably a single-layer board made of a dielectric or a magnetic material.

In the electromagnetic-coupling module 1k of the eleventh example, the feeder circuit 56 is primarily coupled to the radiation element 20 magnetically. Accordingly, as in the case of each of the above-described examples, this electromagnetic-coupling module 1k receives a high-frequency signal radiated from a reader/writer with the radiation element 20. The electromagnetic-coupling module 1k resonates the feeder circuit 56, and supplies only a reception signal at a predetermined frequency band to the radio IC chip 5. On the other hand, the electromagnetic-coupling module 1k derives a predetermined energy from this reception signal. The electromagnetic-coupling module 1k applies reflection modulation on information stored in the radio IC chip 5, i.e., an input signal, using this energy as a driving source to adjust a transmission signal at a predetermined frequency in the feeder circuit 56. Thereafter, the transmission signal is transmitted to the radiation element 20 from the inductance element of the feeder circuit 56 via magnetic coupling. The transmission signal is transmitted and transferred to the reader/writer from the radiation element 20.

Furthermore, the alignment accuracy is improved since the radio IC chip 5 is provided on the small rigid feeder circuit board 50 as in the case of the first example. The radio IC chip 5 is connectable to the feeder circuit board 50 through solder bumps.

Twelfth Example of Electromagnetic-Coupling Module

Figure 19:
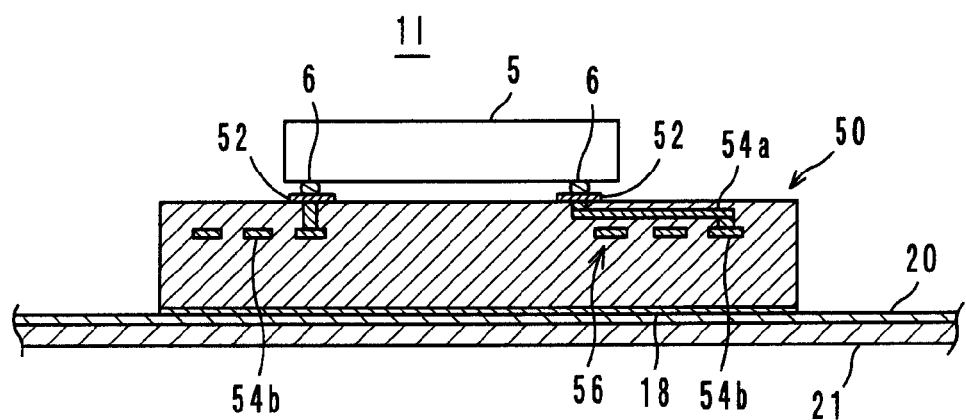
FIG. 19 is a sectional view showing a twelfth example of an electromagnetic-coupling module.
Figure 20:
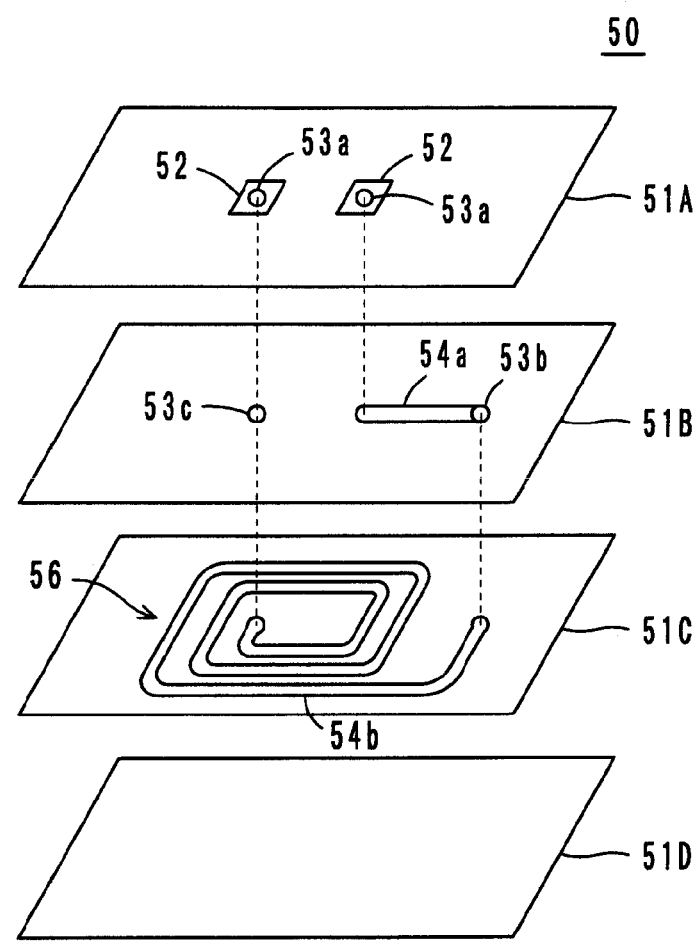
FIG. 20 is an exploded perspective view showing a feeder circuit board of the twelfth example.

As shown in FIG. 19, in an electromagnetic-coupling module 1 1 of a twelfth example, a coil-shaped electrode pattern of a feeder circuit 56 is included in a feeder circuit board 50. As shown in FIG. 20, the feeder circuit board 50 is a board obtained by laminating, press-bonding, and burning ceramic sheets 51A to 51D made of dielectrics. The feeder circuit board 50 is defined by the sheet 51A on which connection electrodes 52 and via hole conductors 53a are provided, the sheet 51B on which a conductive pattern 54a and via hole conductors 53b and 53c are provided, the sheet 51C on which a conductive pattern 54b is provided, and the plain sheet 51D (more than one).

By laminating these sheets 51A to 51D, the feeder circuit board 50, including the feeder circuit 56 having a resonant circuit defined by a spiral inductance element and a capacitance component defined by stray capacitance between wires of the spiral conductors in a coil-shaped electrode pattern, is obtained. The connection electrodes 52 located at both ends of the feeder circuit 56 are connected to the radio IC chip 5 through solder bumps 6. Advantages of the twelfth example are substantially the same as those of the eleventh example.

Thirteenth Example of Electromagnetic-Coupling Module

Figure 21:
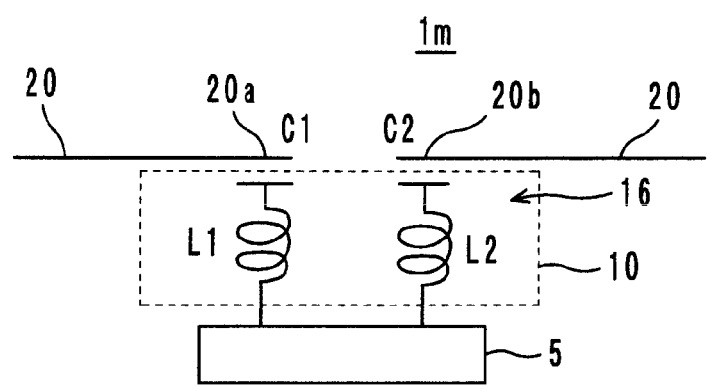
FIG. 21 is a diagram of an equivalent circuit showing a $13^{th}$ example.

As shown as an equivalent circuit in FIG. 21, in an electromagnetic-coupling module 1m of a thirteenth example, a feeder circuit board 10 and a radiation element 20 are capacitively coupled. The feeder circuit board 10 includes a feeder circuit 16 defined by two LC series resonant circuits. One end of each of inductance elements L1 and L2 is connected to a radio IC chip 5. The other ends are connected to capacitor electrodes 72a and 72b (see FIG. 22) defining capacitance elements C1 and C2 provided on the surface of the board 10. Additionally, ends 20a and 20b of a radiation element 20 function as the other capacitor electrodes constituting the capacitance elements C1 and C2.

Figure 22:
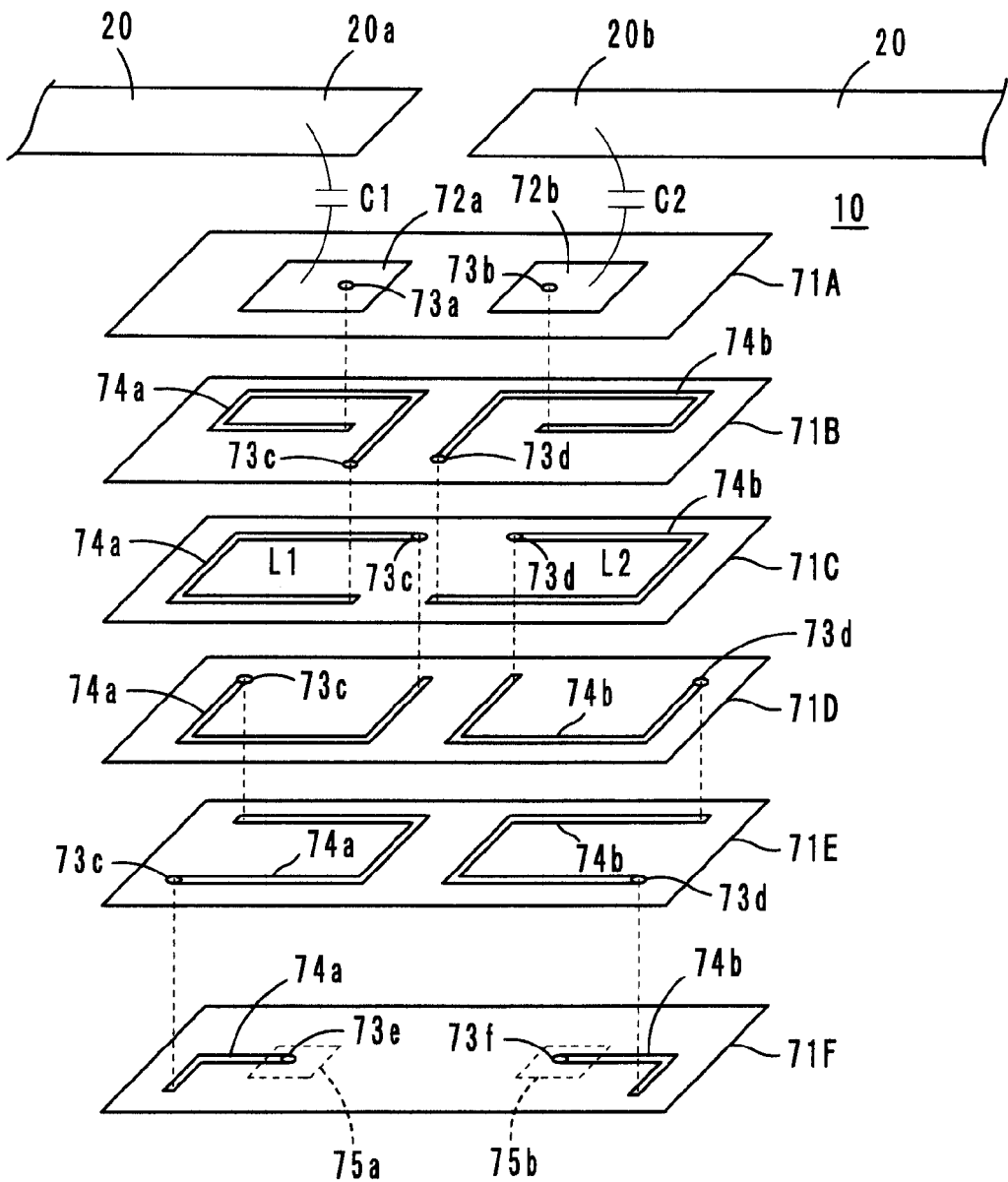
FIG. 22 is an exploded perspective view showing a feeder circuit board of the $13^{th}$ example.

More specifically, as shown in FIG. 22, the feeder circuit board 10 is a board obtained by laminating, press-bonding, and burning ceramic sheets 71A to 71F made of dielectrics. The feeder circuit board 10 is defined by the sheet 71A on which capacitor electrodes 72a and 72b and via hole conductors 73a and 73b are provided, the sheets 71B to 71E on which conductive patterns 74a and 74b and via hole conductors 73c and 73d are provided, and the sheet 71F on one surface on which conductive patterns 74a and 74b are provided and on the other surface on which connection electrodes 75a and 75b are provided. The conductive patterns 74a and 74b and the connection electrodes 75a and 75b are connected through via hole conductors 73e and 73f.

By laminating the sheets 71A to 71F, the feeder circuit 16, defined by two LC series resonant circuits in which the inductor elements L1 and L2 and the capacitance elements C1 and C2 serially connected to the inductance elements L1 and L2 are connected, is obtained. The feeder circuit board 10 is adhered to the radiation element 20 preferably by adhesive, whereby capacitor electrodes 72a and 72b, which are plane electrode patterns arranged substantially parallel to the radiation element 20, face the ends 20a and 20b of the radiation element 20 through an insulating adhesion layer to define the capacitance elements C1 and C2. In addition, the connection electrodes 75a and 75b are connected to the radio IC chip 5 through solder bumps, whereby one end of each of the inductance elements L1 and L2 is connected to the radio IC chip 5. Accordingly, the radio IC chip 5 and the feeder circuit board 10 are DC-connected.

Meanwhile, if the adhesive includes, for example, dielectric power, the adhesion layer has a property as a dielectric. Accordingly, it is possible to increase the capacitance of the capacitance elements C1 and C2. Additionally, the capacitor electrodes 72a and 72b, i.e., second-board-side electrode patterns, are provided on a surface of the back surface of the feeder circuit board 10 in this example. However, the capacitor electrodes 72a and 72b may be provided inside the feeder circuit board 10 (however, near the radiation element 20). In addition, the capacitor electrodes 72a and 72b may be provided on an inner layer of the board 10.

Advantages of the thirteenth example are substantially the same as those of the first example. More specifically, this electromagnetic-coupling module 1m receives a high-frequency signal (e.g., UHF frequency band) radiated from a reader/writer, not shown, with the radiation element 20. The electromagnetic-coupling module 1m resonates the feeder circuit 16 (an LC series resonant circuit defined by the inductance element L1 and the capacitance element C1 and an LC series resonant circuit defined by the inductance element L2 and the capacitance element C2) that capacitively coupled to the radiation element 20, and supplies only a reception signal at a predetermined frequency band to the radio IC chip 5. On the other hand, the electromagnetic-coupling module 1m derives a predetermined energy from this reception signal. The electromagnetic-coupling module 1m applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 via capacitive coupling by the capacitance elements C1 and C2. The transmission signal is transmitted and transferred to the reader/writer from the radiation element 20.

Fourteenth Example of Electromagnetic-Coupling Module

Figure 23:
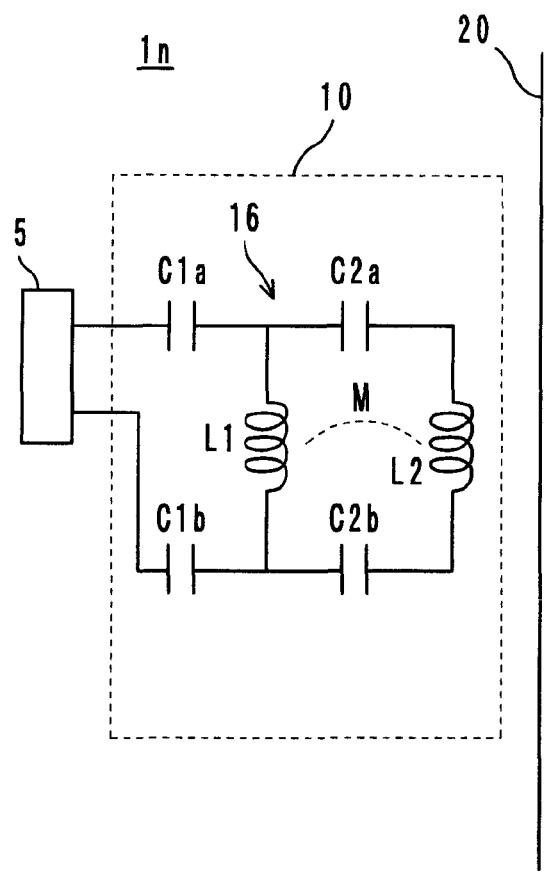
FIG. 23 is a diagram of an equivalent circuit showing a $14^{th}$ example of an electromagnetic-coupling module.

As shown as an equivalent circuit in FIG. 23, in an electromagnetic-coupling module 1n of a fourteenth example, a feeder circuit 16 has inductance elements L1 and L2 magnetically coupled to each other. The inductance element L1 is connected to a radio IC chip 5 through capacitance elements C1a and C1b. The inductance element L1 is connected, in parallel, to the inductance element L2 through capacitance elements C2a and C2b. In other words, the feeder circuit 16 is configured to include an LC series resonant circuit defined by the inductance element L1 and the capacitance elements C1a and C1b and an LC series resonant circuit defined by the inductance element L2 and the capacitance elements C2a and C2b. Each of the resonant circuits is coupled via magnetic coupling denoted by M in FIG. 23. In addition, both inductance elements L1 and L2 are coupled to the radiation element 20 magnetically.

Figure 24:
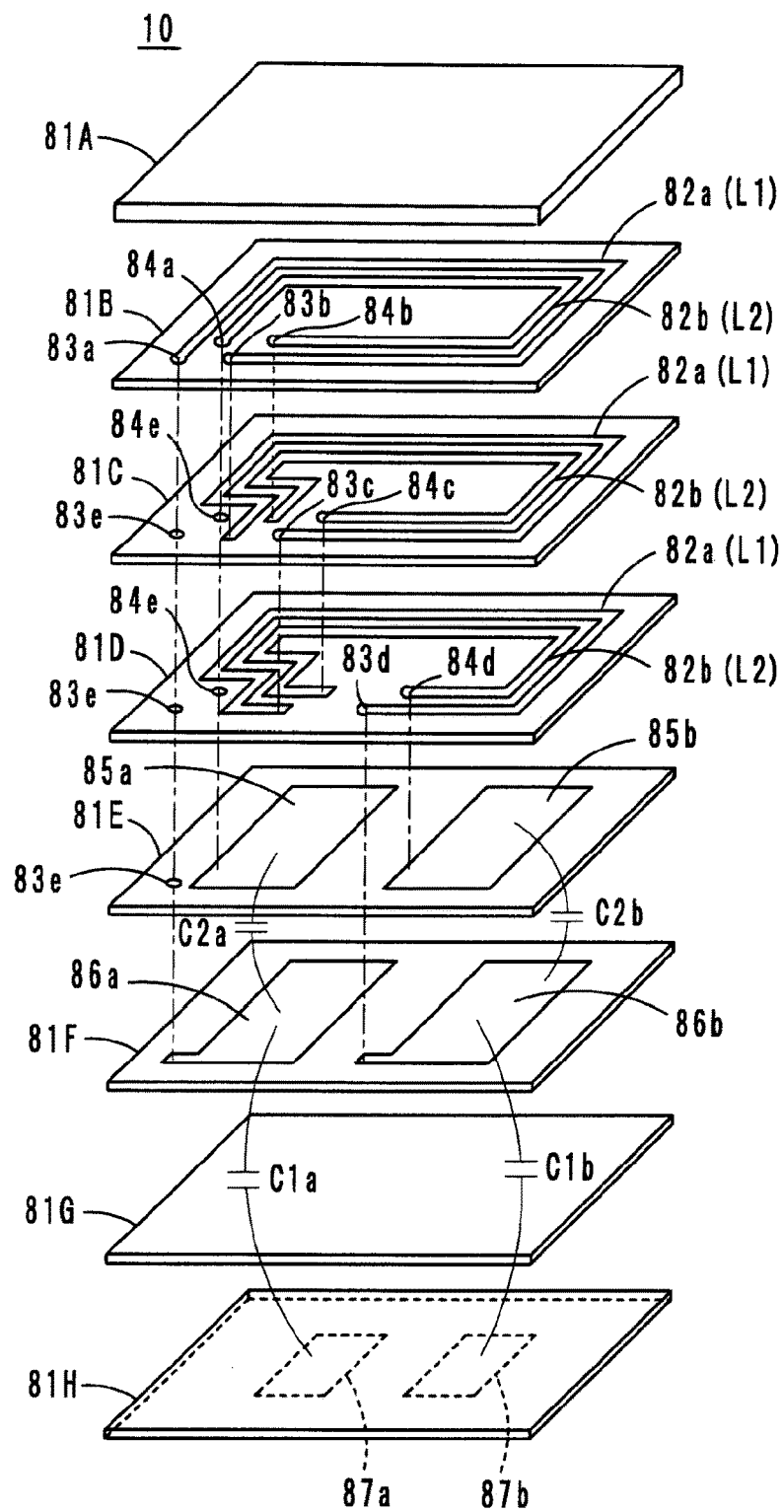
FIG. 24 is an exploded perspective view showing a feeder circuit board of the $14^{th}$ example.

More specifically, as shown in FIG. 24, the feeder circuit board 10 is a board obtained by laminating, press-bonding, and burning ceramic sheets 81A to 81H made of dielectrics. The feeder circuit board 10 is defined by the plain sheet 81A, the sheet 81B on which conductive patterns 82a and 82b and via hole conductors 83a, 83b, 84a, and 84b are provided, the sheet 81C on which the conductive patterns 82a and 82b and via hole conductors 83c, 84c, 83e, and 84e are provided, the sheet 81D on which the conductive patterns 82a and 82b and via hole conductors 83d, 84d, 83e, and 84e are provided, the sheet 81E on which capacitor electrodes 85a and 85b and a via hole conductor 83e are provided, the sheet 81F on which the capacitor electrodes 86a and 86b are provided, the plain sheet 81G, and the sheet 81H on the back surface of which capacitor electrodes 87a and 87b are provided.

By laminating the sheets 81A to 81H, the conductive patterns 82a are connected through the via hole conductors 83b and 83c to define the inductance element L1. The conductive patterns 82b are connected through the via hole conductors 84b and 84c to define the inductance element L2. The capacitance element C1a is defined by the capacitor electrodes 86a and 87a. The capacitor electrode 86a is connected to one end of the inductance element L1 through the via hole conductor 83e. The capacitance element C1b is defined by the capacitance electrodes 86b and 87b. The capacitor electrode 86b is connected to the other end of the inductance element L1 through the via hole conductor 83d.

Furthermore, the capacitance element C2a is defined by the capacitor electrodes 85a and 86a. The capacitor electrode 85a is connected to one end of the inductance element L2 through the via hole conductor 84e. The capacitance element C2b is defined by the capacitor electrodes 85b and 86b. The capacitor electrode 85b is connected to the other end of the inductance element L2 through the via hole conductor 84d.

Advantages of the fourteenth example are substantially the same as those of the first example. More specifically, this electromagnetic-coupling module 1n receives a high-frequency signal (e.g., UHF frequency band) radiated from a reader/writer, not shown, with the radiation element 20. The electromagnetic-coupling module 1n resonates the feeder circuit 16 (an LC series resonant circuit defined by the inductance element L1 and the capacitance elements C1a and C1b and an LC series resonant circuit defined by the inductance element L2 and the capacitance elements C2a and C2b) that is primarily magnetically coupled to the radiation element 20, and supplies only a reception signal at a predetermined frequency band to the radio IC chip 5. On the other hand, the electromagnetic-coupling module 1n derives a predetermined energy from this reception signal. The electromagnetic-coupling module 1n applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 from the inductance elements L1 and L2 in the feeder circuit 16 via magnetic coupling. The transmission signal is transmitted and transferred to the reader/writer from the radiation element 20.

Figure 25:
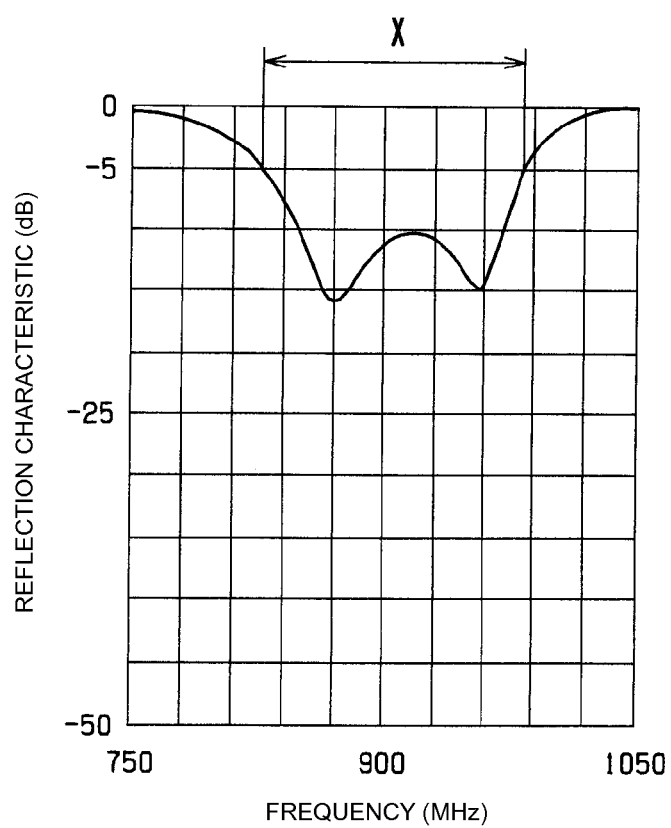
FIG. 25 is a graph showing a reflection characteristic of the $14^{th}$ example.

In particular, in this fourteenth example, in the reflection characteristic, the frequency band is widened as denoted by a bandwidth X in FIG. 25. This results from the fact that the feeder circuit 16 is defined by a plurality of LC resonant circuits including inductance elements L1 and L2 magnetically coupled to each other at a high coupling degree. In addition, since the capacitance elements C1a and C1b are inserted downstream of the radio IC chip 5, the surge withstand capability is improved.

Fifteenth Example of Electromagnetic-Coupling Module

Figure 26:
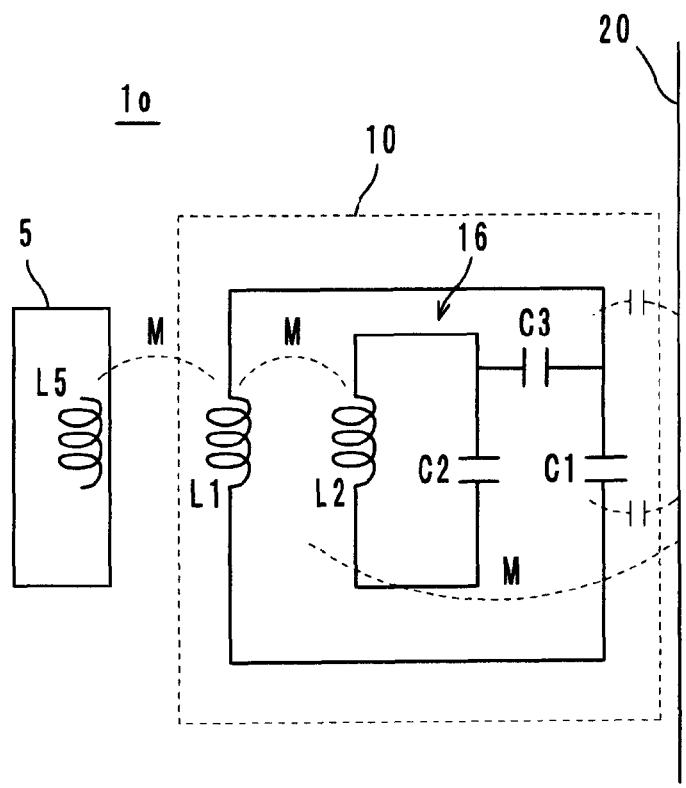
FIG. 26 is a diagram of an equivalent circuit showing a $15^{th}$ example of an electromagnetic-coupling module.

As shown as an equivalent circuit in FIG. 26, in an electromagnetic-coupling module 1o of a fifteenth example, a feeder circuit 16 has inductance elements L1 and L2 magnetically coupled to each other at a high coupling degree. The inductance element L1 magnetically couples to an inductance element L5 provided in a radio IC chip 5. The inductance element L2 and a capacitance element C2 define an LC parallel resonant circuit. In addition, a capacitance element C1 capacitively couples to a radiation element 20. Another capacitance element C3 is inserted between the capacitance elements C1 and C2.

Figure 27:
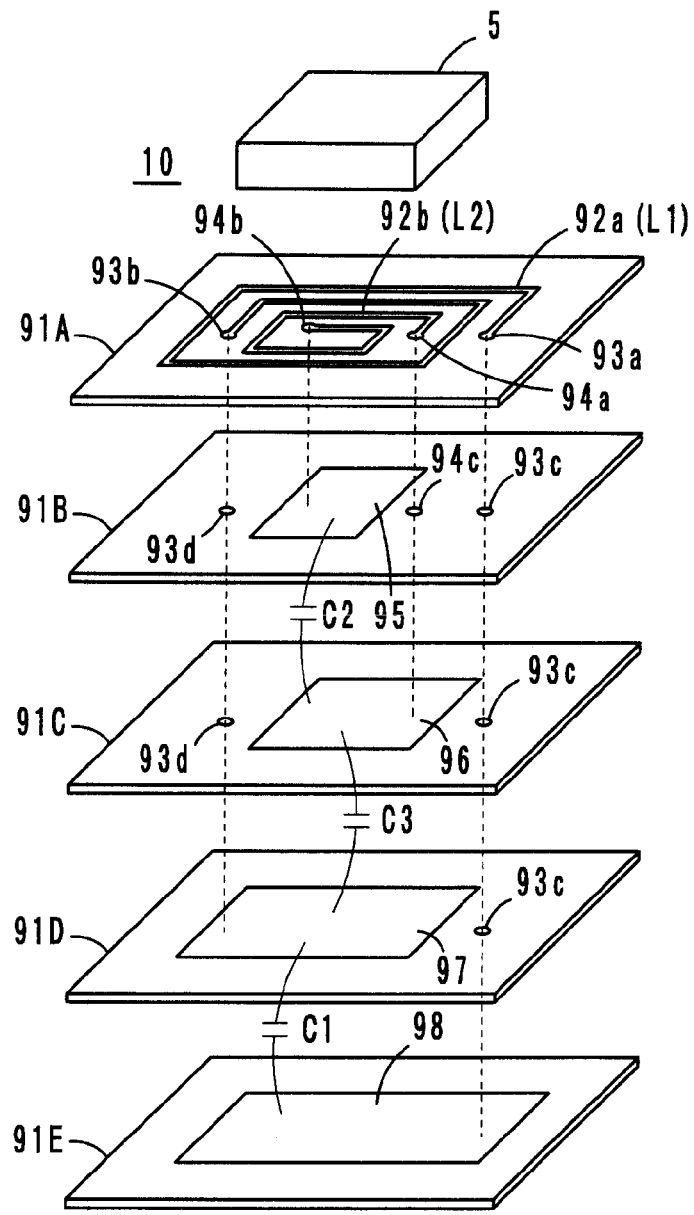
FIG. 27 is an exploded perspective view showing a feeder circuit board of the $15^{th}$ example.

More specifically, as shown in FIG. 27, a feeder circuit board 10 is a board obtained by laminating, press-bonding, and burning ceramic sheets 91A to 91E made of dielectrics. The feeder circuit board 10 is defined by the sheet 91A on which conductive patterns 92a and 92b and via hole conductors 93a, 93b, 94a, and 94b are provided, a sheet 91B on which a capacitor electrode 95 and via hole conductors 93c, 93d, and 94c are provided, the sheet 91C on which a capacitor electrode 96 and via hole conductors 93c and 93d are provided, the sheet 91D on which a capacitor electrode 97 and a via hole conductor 93c are provided, and the sheet 91E on which a capacitor electrode 98 is provided.

By laminating these sheets 91A to 91E, the inductance element L1 is defined by the conductive pattern 92a. The inductance element L2 is defined by the conductive pattern

92b. The capacitance element C1 is defined by the capacitor electrodes 97 and 98. One end of the inductance element L1 is connected to the capacitor electrode 98 through the via hole conductors 93a and 93c. The other end is connected to the capacitor electrode 97 through the via hole conductors 93b and 93d. The capacitance element C2 is defined by the capacitor electrodes 95 and 96. One end of the inductance element L2 is connected to the capacitor electrode 96 through the via hole conductors 94a and 94c. The other end is connected to the capacitor electrode 95 through the via hole conductor 94b. Furthermore, the capacitance element C3 is defined by the capacitor electrodes 96 and 97.

Figure 28A:
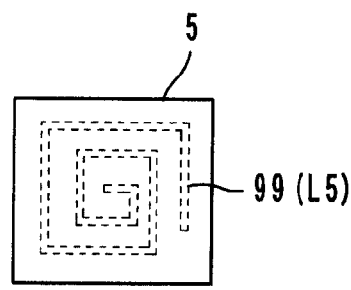
FIGS. 28A and 28B show a radio IC chip of the $15^{th}$ example.
Figure 28B:
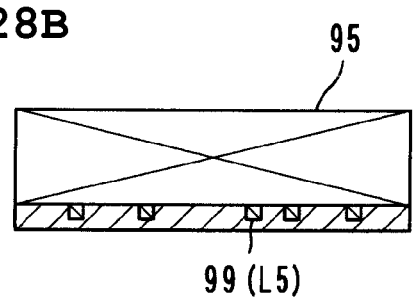

In addition, as shown in FIGS. 28A and 28B, a coil-shaped electrode pattern 99 is provided as a chip-side electrode pattern on a back surface of the radio IC chip 5. The inductance element L5 is defined by the coil-shaped electrode pattern 99. A resin protection film or other suitable protective film is provided on a surface of the coil-shaped electrode pattern 99, such that the inductance elements L1 and L2 defined by coil-shaped electrode patterns, which are board-side electrode patterns, magnetically couple to the coil-shaped electrode pattern 99.

Advantages of the fifteenth example are substantially the same as those of the first example. More specifically, this electromagnetic-coupling module 1o receives a high-frequency signal (e.g., UHF frequency band) radiated from a reader/writer, not shown, with the radiation element 20. The electromagnetic-coupling module 1o resonates the feeder circuit 16 (an LC series resonant circuit defined by the inductance element L2 and the capacitance elements C2) that is capacitively and magnetically coupled to the radiation element 20, and supplies only a reception signal at a predetermined frequency band to the radio IC chip 5. On the other hand, the electromagnetic-coupling module 1o derives a predetermined energy from this reception signal. The electromagnetic-coupling module 1o applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 via capacitive and magnetic coupling. The transmission signal is transmitted and transferred to the reader/writer from the radiation element 20. The feeder circuit 16 and the radio IC chip 5 are magnetically coupled by the inductance elements L1 and L5, thereby power and transmission/reception signals are transmitted.

Sixteenth Example of Electromagnetic-Coupling Module

Figure 29:
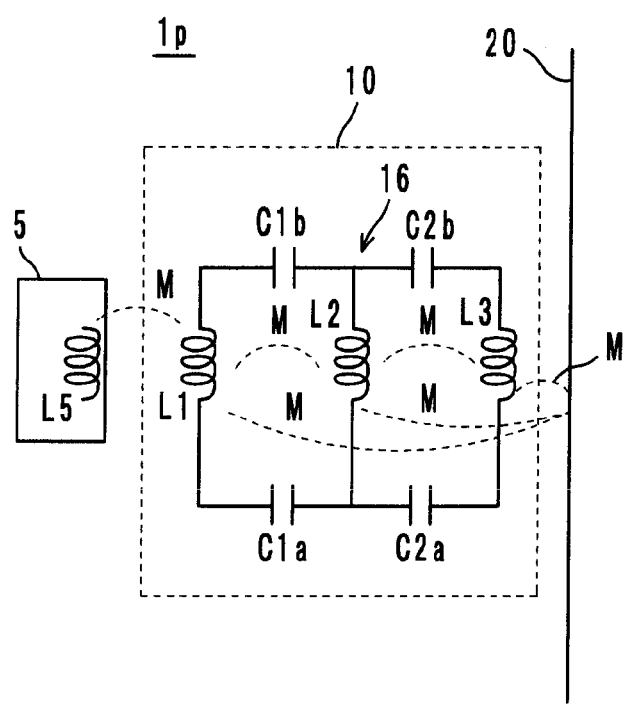
FIG. 29 is a diagram of an equivalent circuit showing a $16^{th}$ example of an electromagnetic-coupling module.

As shown as an equivalent circuit in FIG. 29, in an electromagnetic-coupling module 1p of a sixteenth example, a feeder circuit 16 has inductance elements L1, L2, and L3 magnetically coupled to each other at a high coupling degree. The inductance element L1 magnetically couples to an inductance element L5 provided in a radio IC chip 5. The inductance element L2 and capacitance elements C1a and C1b define an LC series resonant circuit. An inductance element L3 and capacitance elements C2a and C2b define an LC series resonant circuit. In addition, each of the inductance elements L1, L2, and L3 magnetically couples to a radiation element 20.

Figure 30:
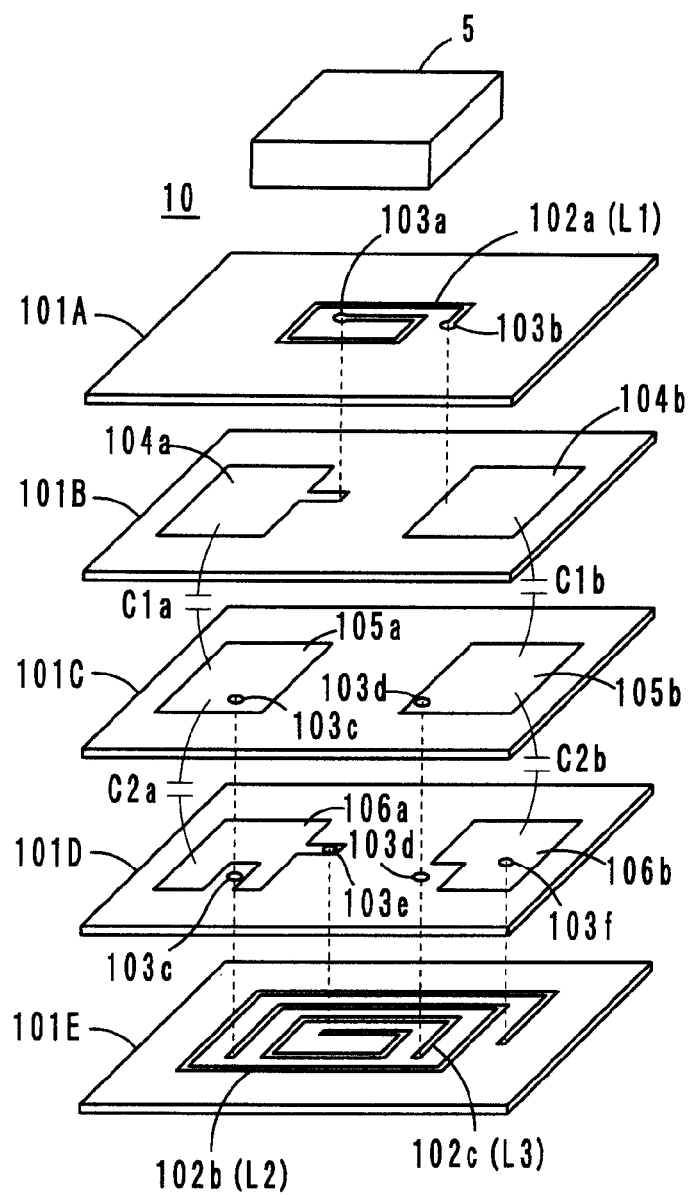
FIG. 30 is an exploded perspective view showing a feeder circuit board of the $16^{th}$ example.

More specifically, as shown in FIG. 30, a feeder circuit board 10 is a board obtained by laminating, press-bonding, and burning ceramic sheets 101A to 101E made of dielectrics. The feeder circuit board 10 is defined by the sheet 101A on which a conductive pattern 102a and via hole conductors 103a and 103b are provided, the sheet 101B on which capacitor electrodes 104a and 104b are provided, the sheet 101C on which capacitor electrodes 105a and 105b and via hole conductors 103c and 103d are provided, the sheet 101D on which capacitor electrodes 106a and 106b and via hole conductors 103c, 103d, 103e, and 103f are provided, and the sheet 101E on which conductive patterns 102b and 102c are provided. That is, the electrodes 104a, 105a, and 106a and the electrodes 104b, 105b, and 106b defining the capacitance elements C1a, C2a, C1b, and C2b are spaced so that magnetic flux caused by the inductance element L1 reaches the inductance elements L2 and L3, and the radiation element 20.

By laminating these sheets 101A to 101E, the inductance element L1 is defined by the conductive pattern 102a. An inductance element L2 is defined by the conductive pattern 102b. The inductance element L3 is defined by the conductive pattern 102c. The capacitance element C1a is defined by the capacitor electrodes 104a and 105a. The capacitance element C1b is defined by the capacitor electrodes 104b and 105b. In addition, the capacitance element C2a is defined by the capacitor electrodes 105a and 106a. The capacitance element C2b is defined by the capacitor electrodes 105b and 106b.

One end of the inductance element L1 is connected to the capacitor electrode 104a through the via hole conductor 103a. The other end is connected to the capacitor electrode 104b through the via hole conductor 103b. One end of the inductance element L2 is connected to the capacitor electrode 105a through the via hole conductor 103c. The other end is connected to the capacitor electrode 106b through the via hole conductor 103f. One end of the inductance element L3 is connected to the capacitor electrode 106a through the via hole conductor 103e. The other end is connected to the capacitor electrode 105b through the via hole conductor 103d.

In addition, as shown in FIG. 28, a coil-shaped electrode pattern 99 is provided as a chip-side electrode pattern on a back surface of the radio IC chip 5. The inductance element L5 is defined by the coil-shaped electrode pattern 99. A resin protection film or other suitable protective film is provided on a surface of the coil-shaped electrode pattern 99, such that the inductance element L defined by a coil-shaped electrode pattern, which is a board-side electrode pattern, magnetically couples to the coil-shaped electrode pattern 99.

Advantages of the sixteenth example are substantially the same as those of the fourteenth example. More specifically, this electromagnetic-coupling module 1p receives a high-frequency signal (e.g., UHF frequency band) radiated from a reader/writer, not shown, with the radiation element 20. The electromagnetic-coupling module 1p resonates the feeder circuit 16 (an LC series resonant circuit defined by the inductance element L2 and the capacitance elements C1a and C1b and an LC series resonant circuit defined by the inductance element L3 and the capacitance elements C2a and C2b) that is magnetically coupled to the radiation element 20, and supplies only a reception signal at a predetermined frequency band to the radio IC chip 5. On the other hand, the electromagnetic-coupling module 1p derives a predetermined energy from this reception signal. The electromagnetic-coupling module 1p applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 from the inductance elements L1, L2, and L3 in the feeder circuit 16 via magnetic coupling. The transmission signal is transmitted and transferred to the reader/writer from the radiation element 20.

The feeder circuit 16 and the radio IC chip 5 are magnetically coupled by the inductance elements L1 and L5, and power and transmission and reception signals are transmitted.

In particular, in the sixteenth example, the feeder circuit 16 is defined by a plurality of LC resonant circuits including the inductance elements L2 and L3 that are magnetically coupled to each other. Accordingly, as in the case of the fourteenth example, the frequency band widens.

Seventeenth Example of Electromagnetic-Coupling Module

Figure 31:
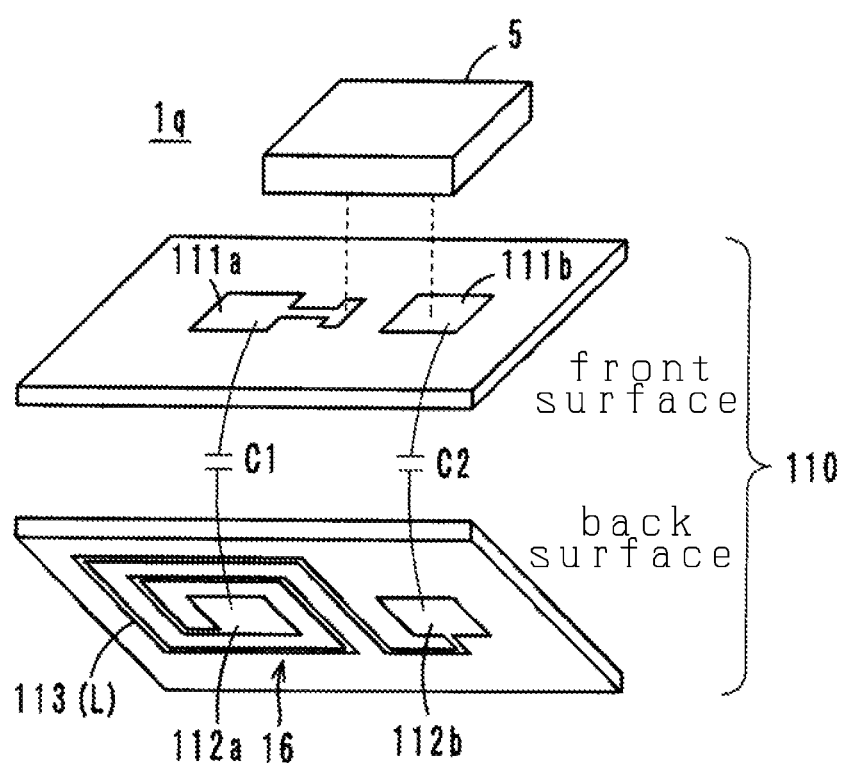
FIG. 31 is an exploded perspective view showing a $17^{th}$ example of an electromagnetic-coupling module.

In an electromagnetic-coupling module 1q of a seventeenth example, a feeder circuit board 110 is defined by a single-layer board. An equivalent circuit thereof is the same as that in FIG. 3. More specifically, a feeder circuit 16 is defined by an LC series resonant circuit in which capacitance elements C1 and C2 are connected to both ends of an inductance element L. The feeder circuit board 110 is a ceramic board made of a dielectric. As shown in FIG. 31, capacitor electrodes 111a and 111b are provided on a front surface. Capacitor electrodes 112a and 112b and a conductive pattern 113 are provided on a back surface. The capacitance element C1 is defined by the capacitor electrodes 111a and 112a. The capacitance element C2 is provided by the capacitor electrodes 111b and 112b.

Advantages of the seventeenth example are substantially the same as those of the first example. More specifically, this electromagnetic-coupling module 1q receives a high-frequency signal (e.g., UHF frequency band) radiated from a reader/writer, not shown, with the radiation element 20. The electromagnetic-coupling module 1q resonates the feeder circuit 16 (an LC series resonant circuit defined by the inductance element L and the capacitance elements C1 and C2) that is magnetically coupled to the radiation element 20, and supplies only a reception signal at a predetermined frequency band to a radio IC chip 5. On the other hand, the electromagnetic-coupling module 1q derives a predetermined energy from this reception signal. The electromagnetic-coupling module 1q supplies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element 20 from the inductance element L of the feeder circuit 16 via magnetic coupling. The transmission signal is transmitted and transferred to the reader/writer from the radiation element 20.

Figure 32:
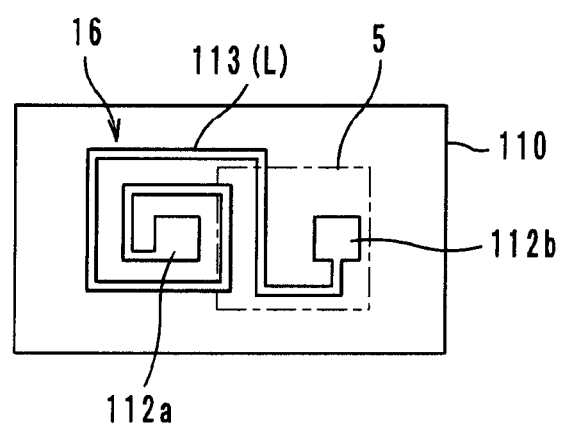
FIG. 32 is a bottom view of a feeder circuit board mounting a radio IC chip in the $17^{th}$ example.
Figure 33:
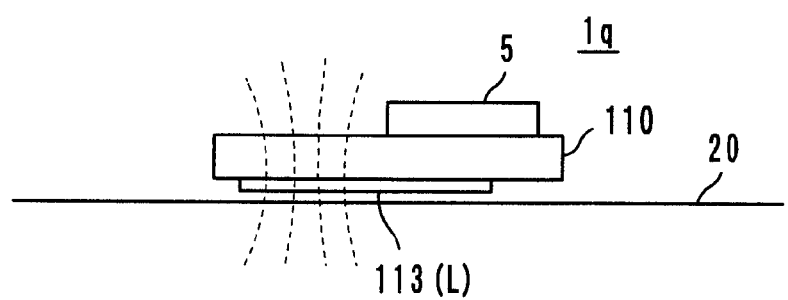
FIG. 33 is a side view of the $17^{th}$ example.

In particular, in the seventeenth example, as shown in FIG. 32 and FIG. 33, the inductance element L is arranged to only partially overlap the radio IC chip 5 in plan view. By this configuration, the magnetic flux caused by the inductance element L is not substantially blocked by the radio IC chip 5, and a rise of the magnetic flux improves.

Figure 34:
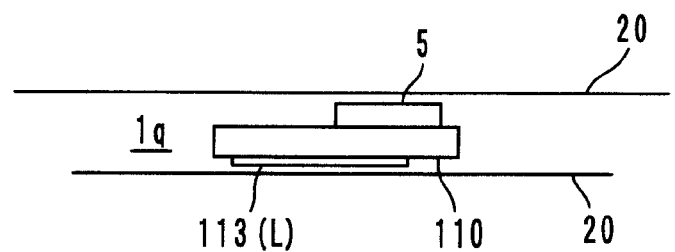
FIG. 34 is a side view showing a modification of the $17^{th}$ example.

Additionally, in the seventeenth example, as shown in FIG. 34, both sides of the feeder circuit board 110 mounting the radio IC chip 5 may be sandwiched by the radiation elements 20 and 20. A magnetic coupling efficiency between the feeder circuit 16 and the radiation elements 20 and 20 is increased, and gain is improved.

Eighteenth Example of Electromagnetic-Coupling Module

Figure 35:
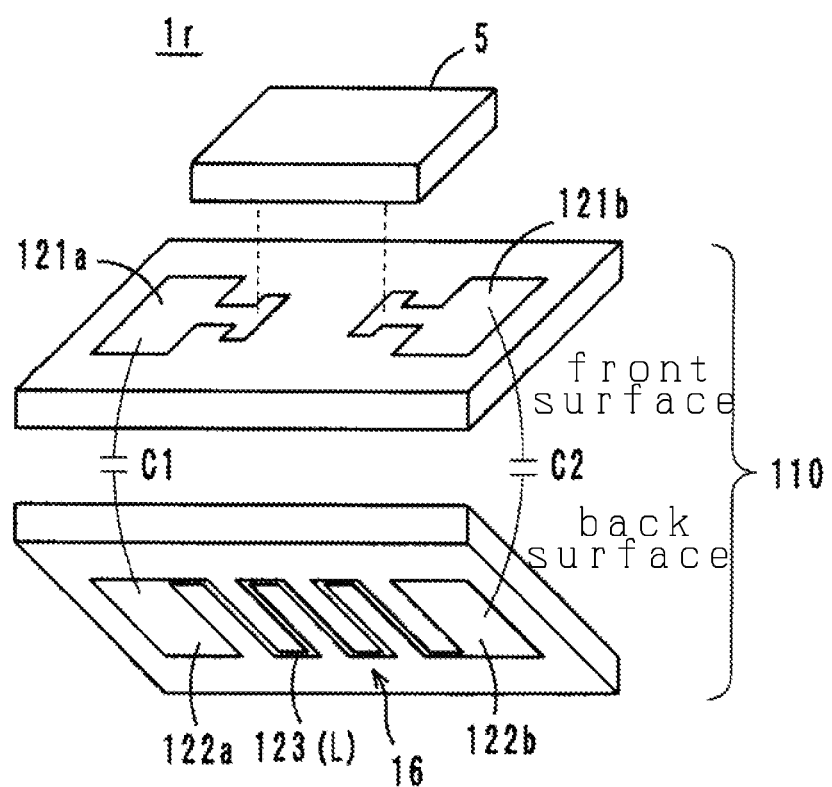
FIG. 35 is an exploded perspective view showing an $18^{th}$ example of an electromagnetic-coupling module.

In an electromagnetic-coupling module 1r of an eighteenth example, an inductance element L has a meander line electrode pattern. An equivalent circuit thereof is substantially the same as that in FIG. 3. More specifically, a feeder circuit 16 is defined by an LC series resonant circuit in which capacitance elements C1 and C2 are connected to both ends of the inductance element L. A feeder circuit board 110 is a ceramic single-layer board made of a dielectric. As shown in FIG. 35, capacitor electrodes 121a and 121b are provided on a front surface. Capacitor electrodes 122a and 122b and a meander conductive pattern 123 are provided on a back surface. The capacitance element C1 is defined by the capacitor electrodes 121a and 122a. The capacitance element C2 is defined by the capacitor electrodes 121b and 122b.

Advantages of the eighteenth example are substantially the same as those of the first example. More specifically, this electromagnetic-coupling module 1r receives a high-frequency signal (e.g., UHF frequency band) radiated from a reader/writer, not shown, with a radiation element (illustration is omitted) facing to the conductive pattern 123. The electromagnetic-coupling module 1r resonates the feeder circuit 16 (an LC series resonant circuit defined by the inductance element L and the capacitance elements C1 and C2) that is magnetically coupled to the radiation element, and supplies only a reception signal at a predetermined frequency band to a radio IC chip 5. On the other hand, the electromagnetic-coupling module 1r derives a predetermined energy from this reception signal. The electromagnetic-coupling module 1r applies reflection modulation on information stored in the radio IC chip 5, i.e., an input signal, using this energy as a driving source to adjust a transmission signal at a predetermined frequency in the feeder circuit 16. Thereafter, the transmission signal is transmitted to the radiation element from the inductance element L in the feeder circuit 16 via magnetic coupling. The transmission signal is transmitted and transferred to the reader/writer from the radiation element.

In particular, in the eighteenth example, the inductance element L is defined by the meander conductive pattern 123. Accordingly, it is effective for transmitting and receiving high-frequency signals.

In addition, in the above-described seventeenth example and this eighteenth example, the feeder circuit board 110 may be defined by a multi-layer board.

Next, preferred embodiments of various articles to which the above-described electromagnetic-coupling modules are attached will be described.

First Preferred Embodiment

Figure 36:
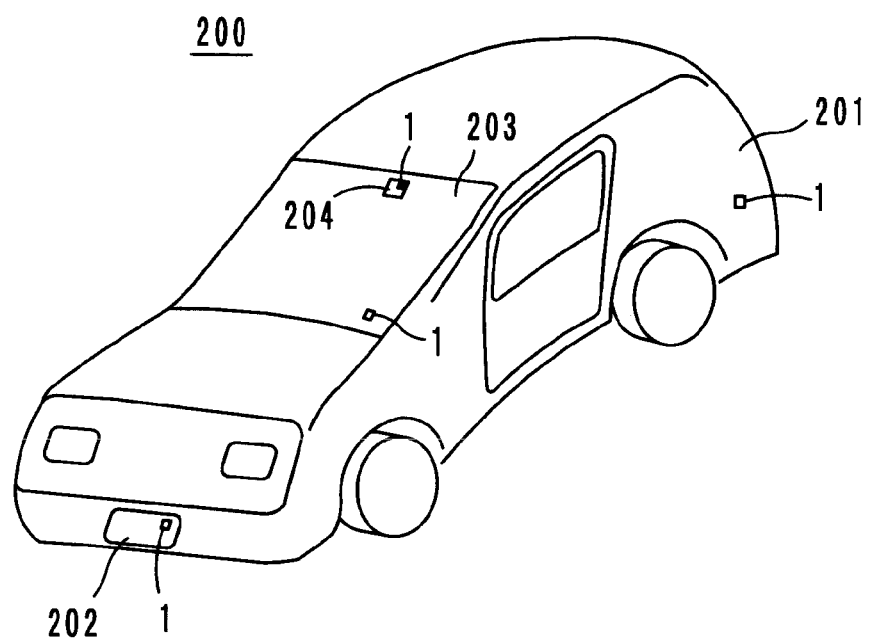
FIG. 36 is a perspective view showing a first preferred embodiment of an electromagnetic-coupling-module-attached article according to the present invention.

As shown in FIG. 36, a first preferred embodiment is applied to an automobile 200. A vehicle body 201, preferably including a steel plate, of the automobile 200, preferably is used as a radiation element. The above-described electromagnetic-coupling module 1 is adhered to a steel plate portion of the vehicle body 201. The above-described feeder circuit is magnetically coupled to the steel plate portion (radiation element). Asset management of the automobile 200 can be performed on the basis of automobile inspection information, automobile registration information, user information, and so on stored in a radio IC chip provided in the electromagnetic-coupling module 1. In addition, the electromagnetic-coupling module 1 may be adhered on (included in) a license plate 202. The license plate 202 may be used as the radiation element. Alternatively, a metal material such as, for example, a defogger (e.g., a defogging conductive pattern) may be used as the radiation element.

When the electromagnetic module 1 is adhered to the license plate 202, it is possible to store information, such as a registration number, a registration date, and automobile inspection information of the automobile 200 in the radio IC chip and transmit the information to a roadside device including a reader. In this case, the license plate 202 functions as an electronic license plate (smart plate). The electromagnetic-coupling module 1 uses a passive system, i.e., a system for generating a current using an electromagnetic wave input from outside as a driving source without including a battery. Accordingly, the electromagnetic-coupling module 1 is does not cause a fault, such as battery failure. Additionally, by mounting an RFID reader on an investigating vehicle, it is possible to easily discover a vehicle having a forged license plate and a stolen vehicle even in an area in which a roadside device is not installed.

In addition, the electromagnetic-coupling module 1 may be adhered to a vehicle inspection sticker 204 disposed on a front window 203 of the automobile 200. The electromagnetic-coupling module 1 is magnetically coupled to the front window 203, which is a dielectric. The front window 203 functions as a radiation element. More specifically, by matching characteristic impedance at an input and output portion of the electromagnetic-coupling module 1 and characteristic impedance at an interface of a dielectric (the front window 203), an electromagnetic wave is input into the dielectric (the front window 203) and the dielectric (the front window 203) functions as an electromagnetic radiator. In this case, since the electromagnetic-coupling module 1 is arranged inside the automobile together with the vehicle inspection sticker 204, an environmental resistance capability may be less that that of the module arranged outside the automobile. Accordingly, the cost is reduced and the risk of robbery is decreased. Additionally, since a large radiation element such as the front window 203 is used, broad directivity and high gain is obtained. In addition, the electromagnetic-coupling module 1 may be directly adhered to a front window and a rear window. The adhesion position may be anywhere on the window as shown in FIG. 36.

Furthermore, the first preferred embodiment may be applied not only to the automobile 200 but also an electric train, an aircraft, a ship, a bus, construction equipment, such as a crane, a forklift, and a vehicle, such as a motor cycle and a bicycle, and asset management thereof can be performed.

Second Preferred Embodiment

Figure 37:
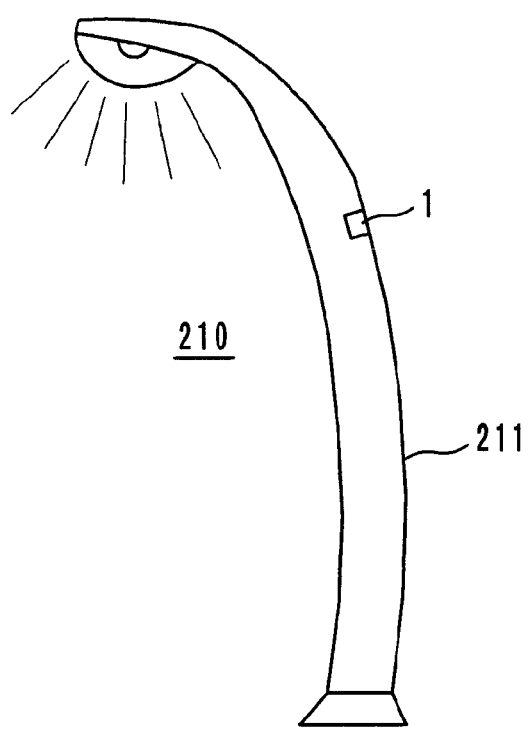
FIG. 37 is a perspective view showing a second preferred embodiment of an electromagnetic-coupling-module-attached article according to the present invention.

As shown in FIG. 37, a second preferred embodiment is applied to an illuminating lamp 210 installed at an expressway. The electronic-coupling module 1 is adhered to a metal pole portion 211 of the illuminating lamp 210. The pole portion 211 is used as a radiation element. A feeder circuit of the electromagnetic-coupling module 1 electromagnetically couples to the pole portion 211. Asset management can be performed on the basis of an installation date, equipment information, and employed material of the illuminating lamp 210 stored in a radio IC chip. Other than the illuminating lamp 210, the asset management of play ground and sports equipment installed in parks and public areas can be performed.

Third Preferred Embodiment

Figure 38:
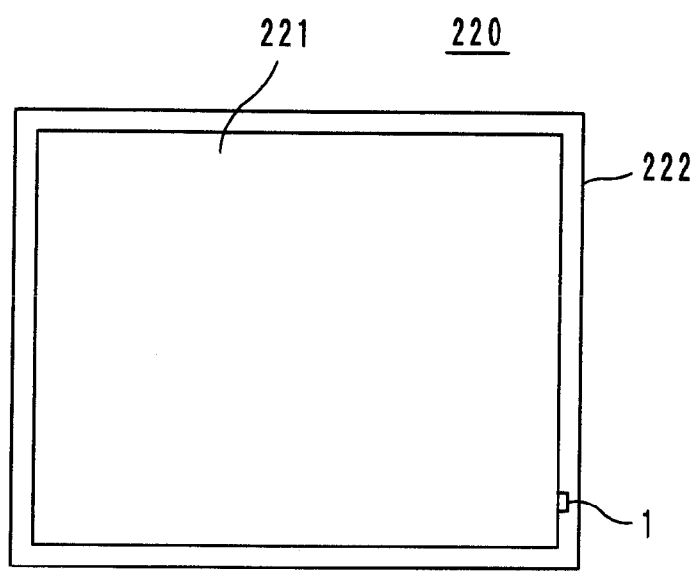
FIG. 38 is an elevational view showing a third preferred embodiment of an electromagnetic-coupling-module-attached article according to the present invention.

As shown in FIG. 38, a third preferred embodiment is applied to an electronic paper 220 including a display screen 221 and a frame portion 222. A metal frame portion 222 of the electronic paper 220 is used as a radiation element. A feeder circuit of the electromagnetic-coupling module 1 electromagnetically couples to the frame portion 222. It is possible to perform, for example, asset management on the basis of a purchase date, a purchase price, and a purchaser of the electronic paper 220 stored in a radio IC chip.

Fourth Preferred Embodiment

Figure 39:
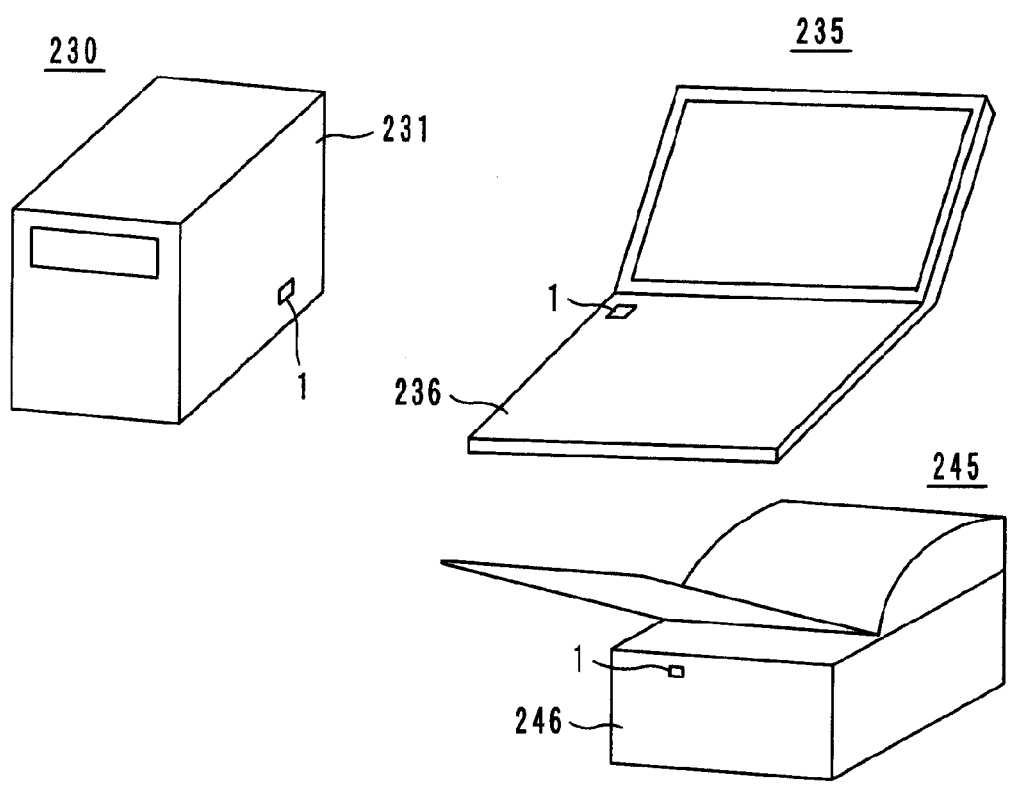
FIG. 39 is a perspective view showing a fourth preferred embodiment of an electromagnetic-coupling-module-attached article according to the present invention.

As shown in FIG. 39, a fourth preferred embodiment utilizes metal housing portions 231 and 236 of a body 230 of a desktop computer and a notebook computer 235 as radiation elements. A feeder circuit of the electromagnetic-coupling module 1 electromagnetically couples to the housing portions 231 and 236. A housing portion 246 of a printer 245 may be utilized as a radiation element. It is possible to perform, for example, asset management of a purchase date and a purchase price of the body 230, the notebook computer 235, and the printer 245.

Fifth Preferred Embodiment

Figure 40:
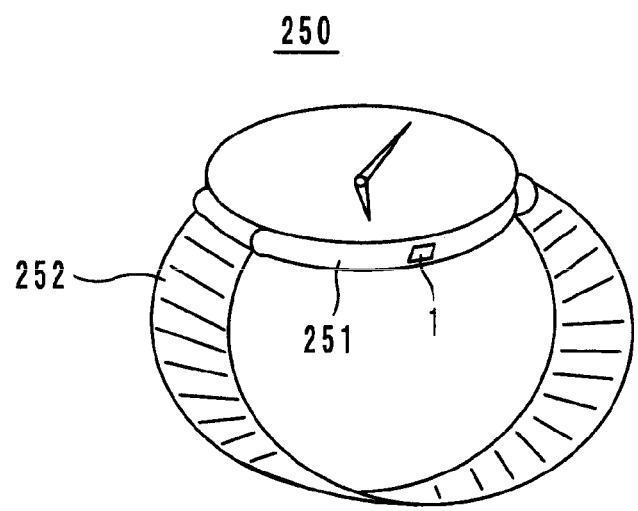
FIG. 40 is a perspective view showing a fifth preferred embodiment of an electromagnetic-coupling-module-attached article according to the present invention.

As shown in FIG. 40, a fifth preferred embodiment utilizes a metal casing 251 or a strap 252 of a watch 250 as a radiation element. A feeder circuit of an electromagnetic-coupling module 1 electromagnetically couples to the casing 251 or the strap 252. It is possible to perform, for example, asset management of a purchase date and a purchase price of the watch 250.

Sixth Preferred Embodiment

Figure 41:
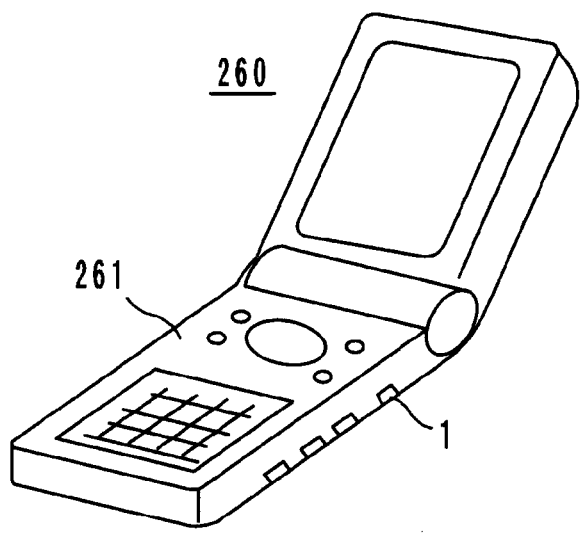
FIG. 41 is a perspective view showing a sixth preferred embodiment of an electromagnetic-coupling-module-attached article according to the present invention.

As shown in FIG. 41, a sixth preferred embodiment utilizes a metal housing portion 261 (conductive paint applied onto the housing if the housing portion is non-metal) of a mobile phone 260 as a radiation element. A feeder circuit of an electromagnetic-coupling module 1 electromagnetically couples to the housing portion 261 or the conductive paint. It is possible to perform, for example, asset management of a purchase date and a purchase price of the mobile phone 260. Additionally, such asset management is not limited to the mobile phone 260. The asset management can be applied to mobile devices such as a PDA, a digital camera, a portable game platform, and a communication device.

Seventh Preferred Embodiment

Figure 42:
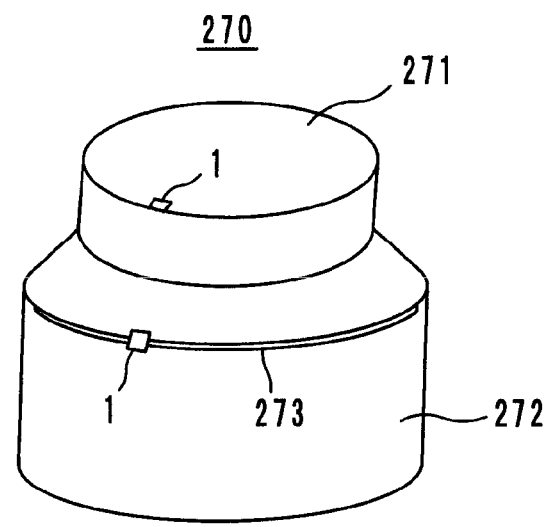
FIG. 42 is a perspective view showing a seventh preferred embodiment of an electromagnetic-coupling-module-attached article according to the present invention.

As shown in FIG. 42, a seventh preferred embodiment utilizes an aluminum lid 271 of a jar 270 used for preserving foods as a radiation element. A feeder circuit of an electromagnetic-coupling module 1 electromagnetically couples to the lid 271, and the electromagnetic-coupling module 1 communicates with a reader/writer of an RFID system. In the seventh preferred embodiment, it is possible to manage assets such as a manufacturing date, a manufacturing date, and kinds of food. Furthermore, inventory control is facilitated if a distribution log of the food is stored in a radio IC chip and timely updated.

If the lid 271 is made of resin or other material and cannot be utilized as the radiation element, a radiation element 273 is printed on a label 272 of the jar 270 as a portion of the design using a conductive paint or other suitable conductive material and the electromagnetic-coupling module 1 is adhered thereto.

Eighth Preferred Embodiment

Figure 43:
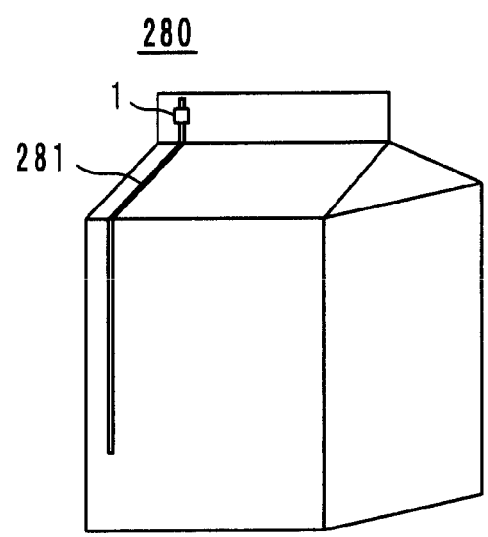
FIG. 43 is a perspective view showing an eighth preferred embodiment of an electromagnetic-coupling-module-attached article according to the present invention.

As shown in FIG. 43, in an eighth preferred embodiment, a radiation element 281 is printed on a carton 280 of milk or juice as a portion of the design using a conductive paint or other suitable conductive material and an electromagnetic-coupling module 1 is adhered thereto. The usage is the same as that of the seventh preferred embodiment. Cans of canned meat may be utilized as a radiation element. A conductive paint or other suitable conductive material printed on wrapping of potato chips may be utilized as a radiation element. That is, the eighth preferred embodiment can be utilized in whole wrapped foods.

Ninth Preferred Embodiment

Figure 44:
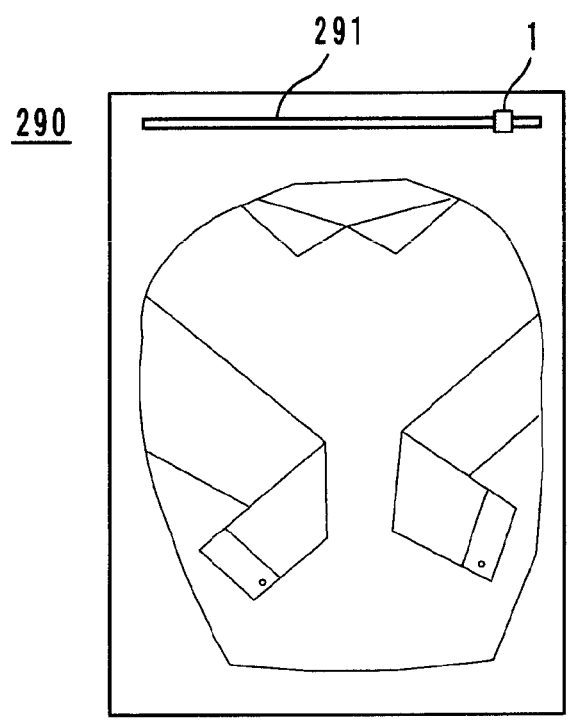
FIG. 44 is an elevational view showing a ninth preferred embodiment of an electromagnetic-coupling-module-attached article according to the present invention.

As shown in FIG. 44, in a ninth preferred embodiment, a radiation element 291 is printed on a clothing wrapping bag 290 as a portion of a design using a conductive paint or other suitable conductive material and an electromagnetic-coupling module 1 is adhered thereto. The usage is the same as that of the seventh preferred embodiment. In addition, articles contained in the wrapping bag 290 are not limited to clothing, and the articles may be stationeries, daily goods, or any other suitable articles.

Tenth Preferred Embodiment

Figure 45:
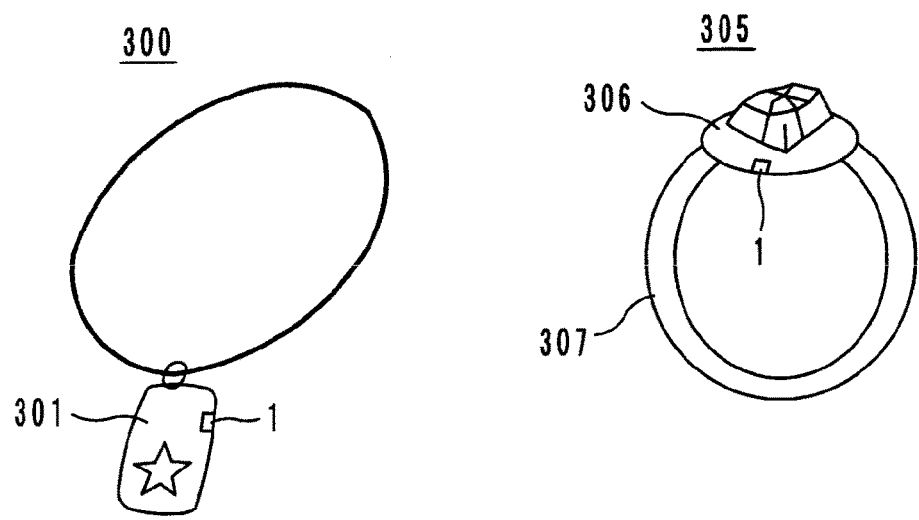
FIG. 45 is a perspective view showing a tenth preferred embodiment of an electromagnetic-coupling-module-attached article according to the present invention.

As shown in FIG. 45, a tenth preferred embodiment utilizes a metal charm 301 of a necklace 300, a metal setting 306 and a metal band 307 of a ring 305 as radiation elements. A feeder circuit of an electromagnetic-coupling module 1 electromagnetically couples to the charm 301 and the setting 306 and the electromagnetic-coupling module communicates with a reader/writer of an RFID system. It is possible to perform, for example, asset management of a purchase date and a purchase price in the tenth preferred embodiment. Furthermore, inventory control is facilitated if a distribution log is stored in a radio IC chip and timely updated.

Eleventh Preferred Embodiment

Figure 46:
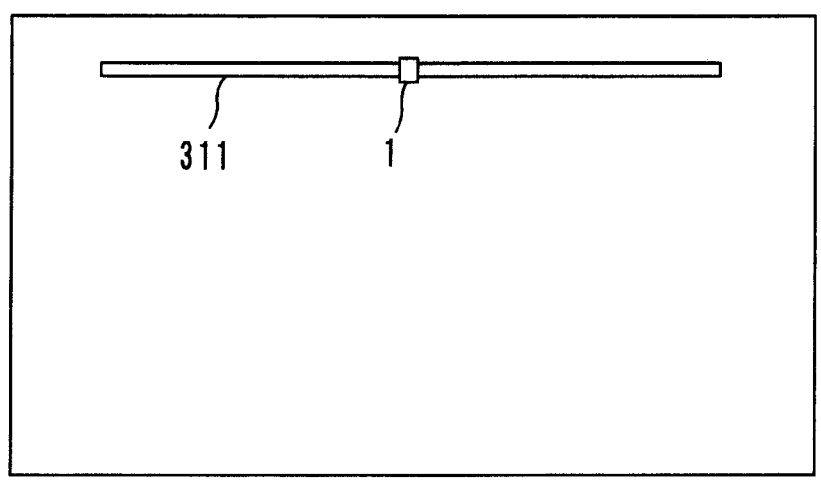
FIG. 46 is a plan view showing an eleventh preferred embodiment of an electromagnetic-coupling-module-attached article according to the present invention.

As shown in FIG. 46, in an eleventh preferred embodiment, a radiation element 311 is printed on a security 310 as a portion of design using a conductive paint or other suitable conductive material and an electromagnetic-coupling module 1 is adhered thereto. The eleventh preferred embodiment can be utilized not only for asset management based on value information stored in a radio IC chip as an RFID system but also for determining the authenticity of the security 310.

In addition, the eleventh preferred embodiment is applied not only to the security 310 but also to paper products, such as banknotes, important documents, invoices, envelopes, receipt paper, cargo labels, and books. Additionally, documents may have a double-sheet-laminated structure and the radiation element 311 and the electromagnetic-coupling module 1 can be sandwiched inside. Alternatively, the radiation element 311 and the electromagnetic-coupling module 1 may be provided inside envelopes, books, or other suitable products.

Twelfth Preferred Embodiment

Figure 47:
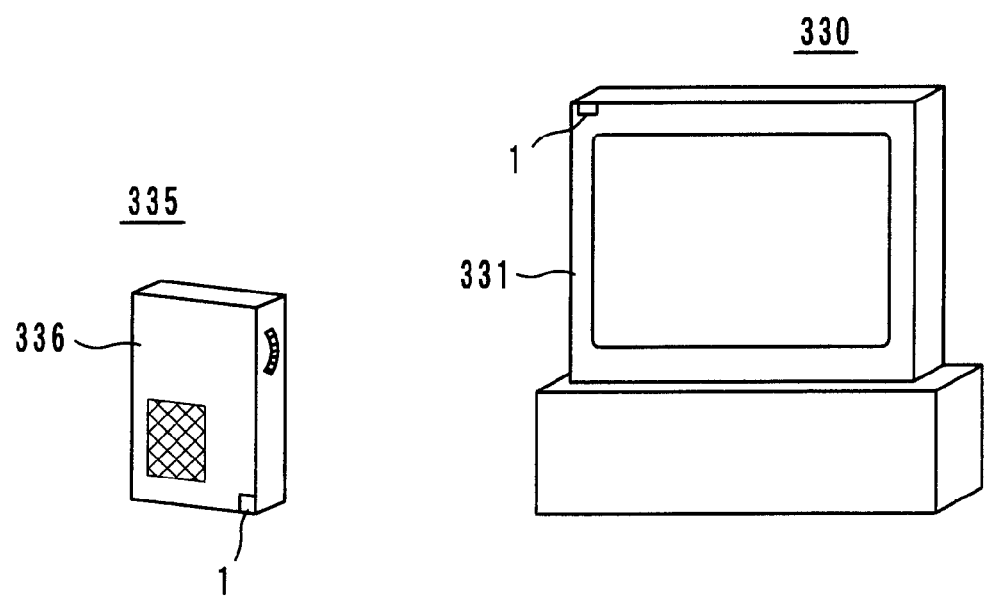
FIG. 47 is a perspective view showing a twelfth preferred embodiment of an electromagnetic-coupling-module-attached article according to the present invention.

As shown in FIG. 47, a twelfth preferred embodiment utilizes metal housing portions 331 and 336 (a conductive paint applied onto the housing if the housing portion is non-metal) of a television 330 and a radio 335 as radiation elements. A feeder circuit of an electromagnetic-coupling module 1 electromagnetically couples to the housing portion 331 or 336 or the conductive paint. It is possible to perform, for example, asset management utilizing an RFID system of the television 330 or the radio 335. Additionally, the twelfth preferred embodiment can be applied to AV home appliances other than the television and the radio.

Thirteenth Preferred Embodiment

Figure 48:
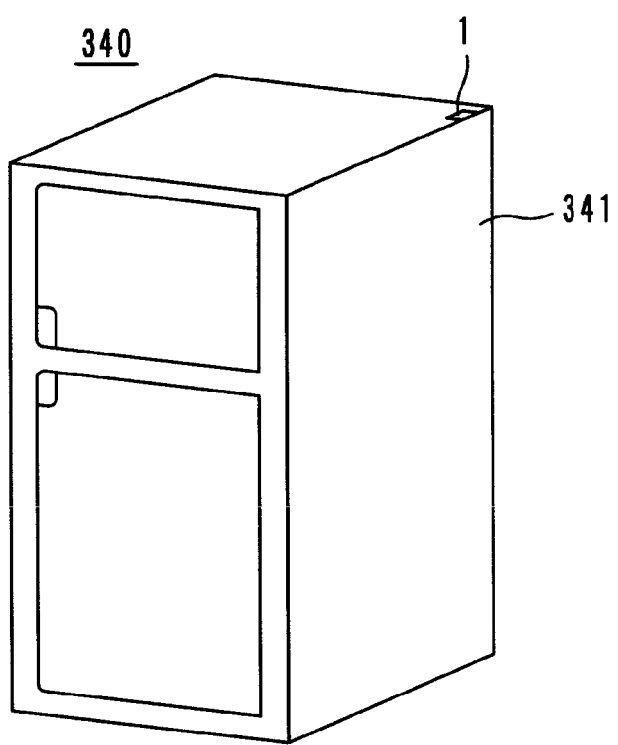
FIG. 48 is a perspective view showing a thirteenth preferred embodiment of an electromagnetic-coupling-module-attached article according to the present invention.

As shown in FIG. 48, a thirteenth preferred embodiment utilizes a metal housing portion 341 of a refrigerator 340 as a radiation element. A feeder circuit of an electromagnetic-coupling module 1 electromagnetically couples to the housing portion 341. Asset management of the refrigerator 340 is provided. In addition, the thirteenth preferred embodiment can be applied to goods other than the refrigerator 340.

Fourteenth Preferred Embodiment

Figure 49:
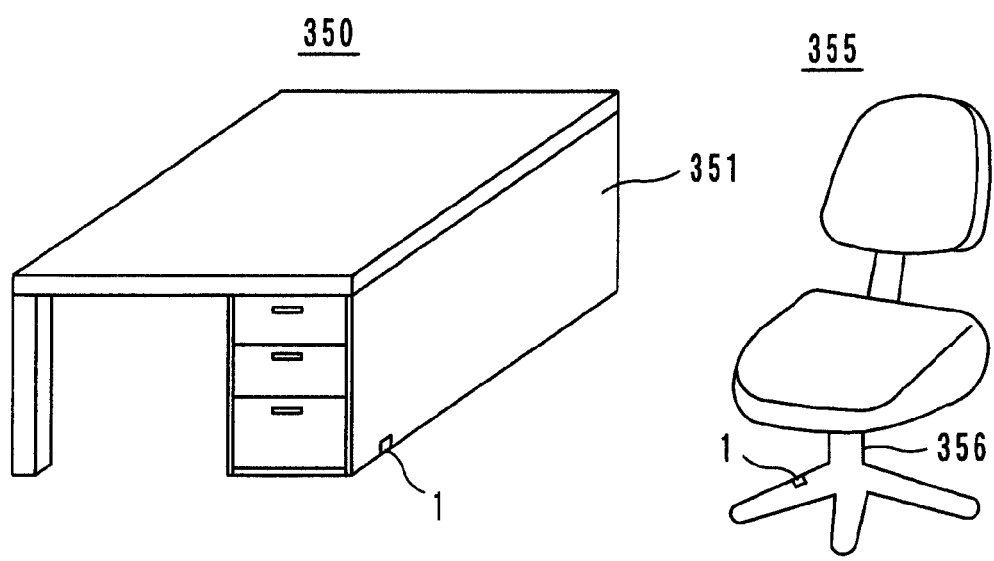
FIG. 49 is a perspective view showing a fourteenth preferred embodiment of an electromagnetic-coupling-module-attached article according to the present invention.

As shown in FIG. 49, a fourteenth preferred embodiment utilizes a metal housing portion 351 of a desk 350 or a metal leg portion 356 of a chair 355 as a radiation element. Each feeder circuit electromagnetically couples to the housing portion 351 or the leg portion 356 and an electromagnetic-coupling module 1 communicates with a reader/writer of an RFID system. The fourteenth preferred embodiment is primarily used for fixed asset management, such as prevention of robbery. Needless to say, the fourteenth preferred embodiment can be used for inventory control at a distribution step if a distribution log is stored in a radio IC chip and is timely updated. Additionally, the fourteenth preferred embodiment can be applied to various office furniture in addition to the desk 350 and the chair 355.

Fifteenth Preferred Embodiment

Figure 50:
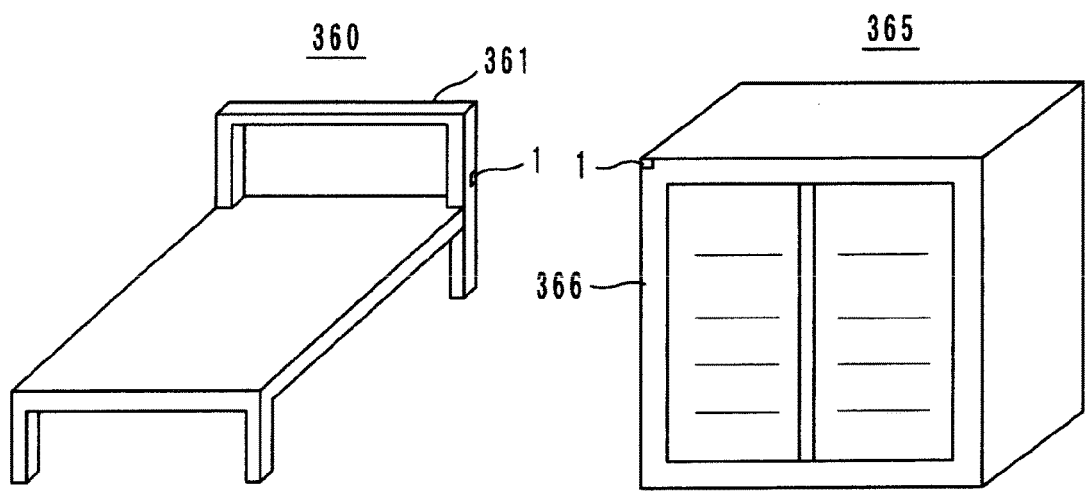
FIG. 50 is a perspective view showing a fifteenth preferred embodiment of an electromagnetic-coupling-module-attached article according to the present invention.

As shown in FIG. 50, a fifteenth preferred embodiment utilizes a metal strut 361 of a bed 360 or a housing portion 366 of a cabinet 365 as a radiation element. Each feeder circuit electromagnetically couples to the strut 361 or the housing portion 366 and an electromagnetic-coupling module 1 communicates with a reader/writer of an RFID system. The usage of the fifteenth preferred embodiment is substantially the same as that of the fourteenth preferred embodiment. Additionally, the fifteenth preferred embodiment can be applied to various home furniture and hotel furnishings other than the bed 360 and the cabinet 365.

Sixteenth Preferred Embodiment

Figure 51:
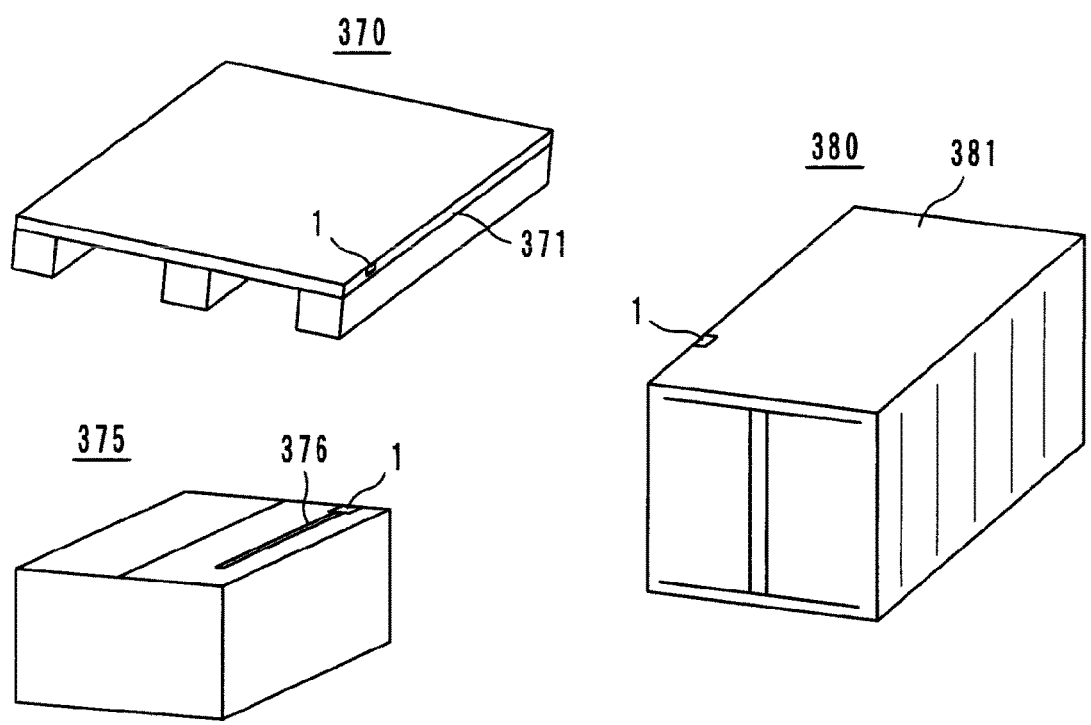
FIG. 51 is a perspective view showing a sixteenth preferred embodiment of an electromagnetic-coupling-module-attached article according to the present invention.

As shown in FIG. 51, a sixteenth preferred embodiment utilizes a metal plate portion 371 (a conductive paint applied onto the plate portion if the plate portion is non-metal) of a pallet 370, a radiation element 376 applied onto a corrugated cardboard 375 using a conductive paint or other suitable conductive material, and a metal housing portion 381 of a distribution container 380 as radiation elements. Each feeder circuit electromagnetically couples to the metal plate portion 371, the radiation element 376, or the housing portion 381, and an electromagnetic-coupling module 1 communicates with a reader/writer of an RFID system. The sixteenth preferred embodiment is used for fixed asset management or goods distribution management.

Seventeenth Preferred Embodiment

Figure 52:
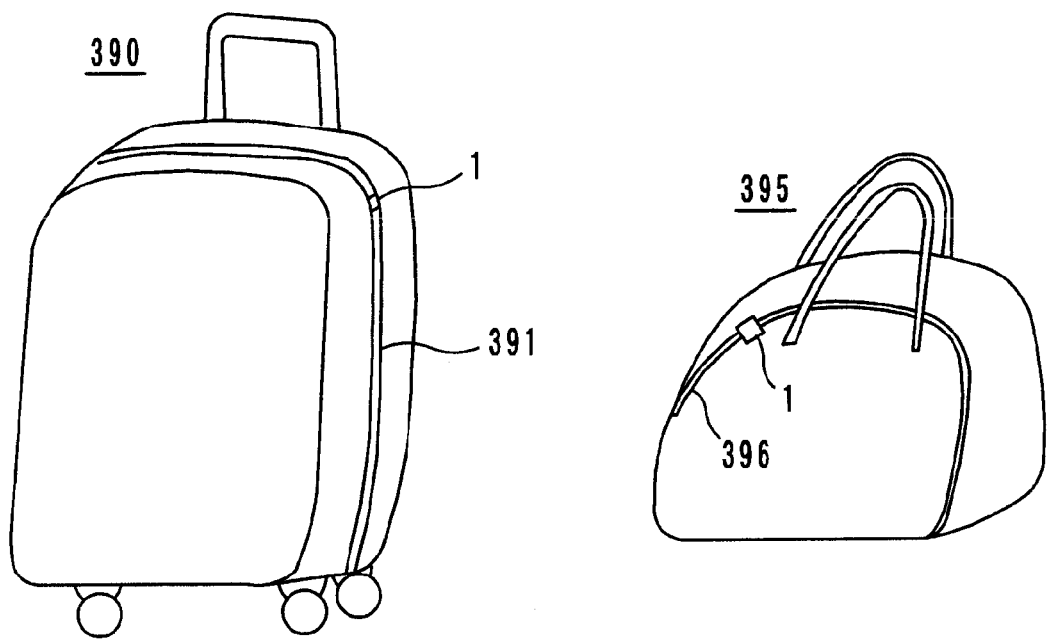
FIG. 52 is a perspective view showing a seventeenth preferred embodiment of an electromagnetic-coupling-module-attached article according to the present invention.

As shown in FIG. 52, in a seventeenth preferred embodiment, an electromagnetic-coupling module 1 is adhered to a metal fastener portion 391 of a suitcase 390 or a radiation element 396 printed on a surface of a bag 395 as part of the design using a conductive paint or other suitable conductive material. A feeder circuit electromagnetically couples to the fastener portion 391 or the radiation element 396 and the electromagnetic-coupling module 1 communicates with a reader/writer of an RFID system. The seventeenth preferred embodiment can be used not only for asset management of the suitcase 390 and the bag 395 but also for distribution management at airports.

Eighteenth Preferred Embodiment

Figure 53:
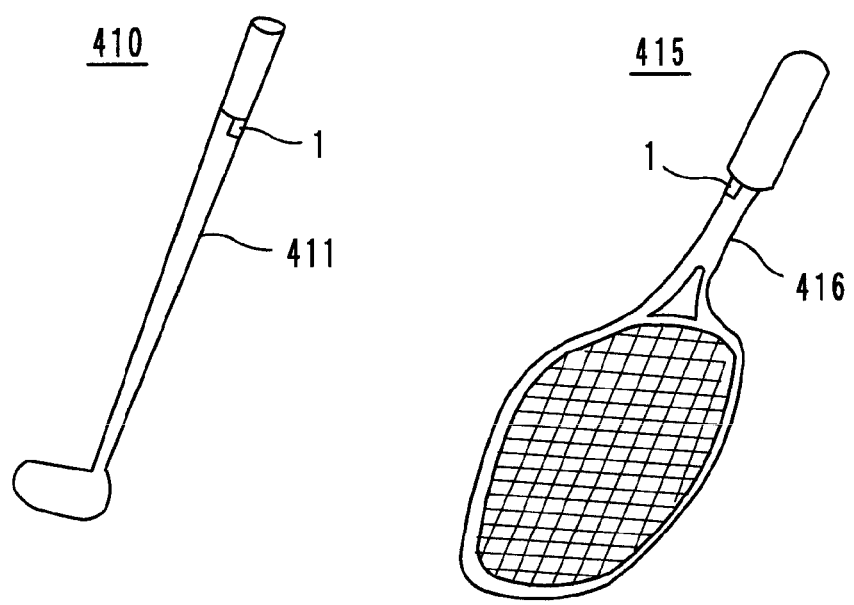
FIG. 53 is a perspective view showing an eighteenth preferred embodiment of an electromagnetic-coupling-module-attached article according to the present invention.

As shown in FIG. 53, an eighteenth preferred embodiment utilizes a carbon shaft 411 of a golf club 410 or a carbon shaft 416 of a tennis racket 415 as a radiation element. Each feeder circuit electromagnetically couples to the shaft 411 or 416 and an electromagnetic-coupling module 1 communicates with a reader/writer of an RFID system. The eighteenth preferred embodiment is used for the above-mentioned fixed asset management and goods distribution management. The eighteenth embodiment can be applied to any sporting goods item.

Nineteenth Preferred Embodiment

Figure 54:
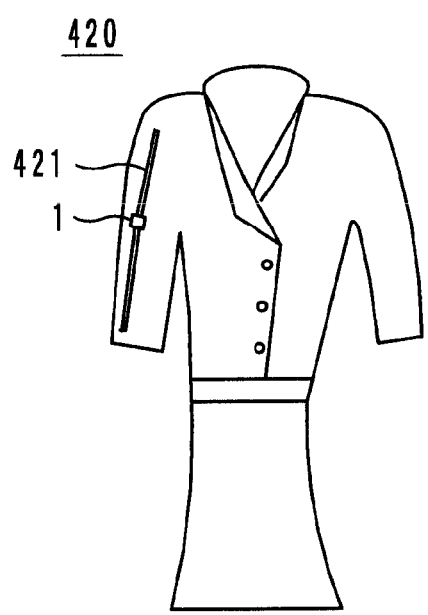
FIG. 54 is a perspective view showing a nineteenth preferred embodiment of an electromagnetic-coupling-module-attached article according to the present invention.

As shown in FIG. 54, in a nineteenth preferred embodiment, an electromagnetic-coupling module 1 is adhered to a radiation element 421 provided on clothing 420 as part of the design using a conductive paint or other suitable conductive material. A feeder circuit electromagnetically couples to the radiation element 421 and the electromagnetic-coupling module 1 communicates with a reader/writer of an RFID system. By storing a serial number, a manufacturing date, a price, and other useful information about the clothing 420 in a radio IC chip, the nineteenth preferred embodiment is used for fixed asset management and goods distribution management.

Twentieth Preferred Embodiment

Figure 55:
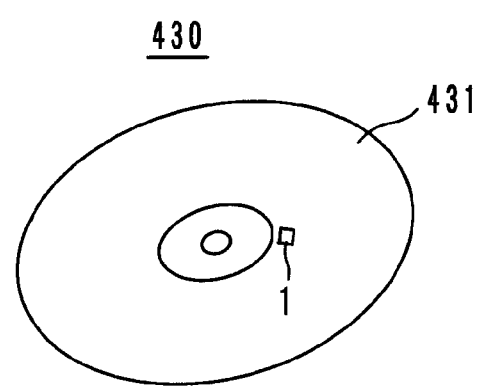
FIG. 55 is a perspective view showing a twentieth preferred embodiment of an electromagnetic-coupling-module-attached article according to the present invention.

As shown in FIG. 55, a twentieth preferred embodiment utilizes aluminum evaporation film 431 of a recording medium 430, such as a DVD or a CD, as a radiation element. A feeder circuit electromagnetically couples to the aluminum evaporation film 431 and an electromagnetic-coupling module 1 communicates with a reader/writer of an RFID system.

In the twentieth preferred embodiment, the electromagnetic-coupling module 1 can be used not only for asset management and distribution management, but also for prevention of illegal copying by configuring a player such that the player cannot perform playback when information is not given by a radio IC chip.

Twenty First Preferred Embodiment

Figure 56:
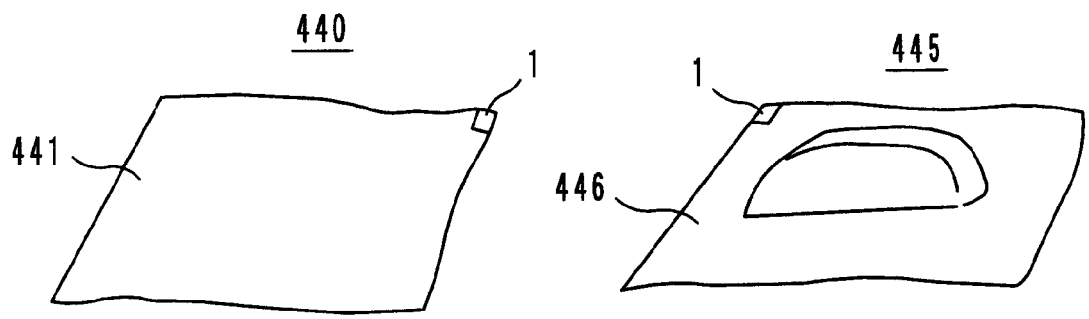
FIG. 56 is a perspective view showing a twenty first preferred embodiment of an electromagnetic-coupling-module-attached article according to the present invention.

As shown in FIG. 56, a twenty first preferred embodiment utilizes aluminum films 441 and 446 of packages 440 and 445 of medical and pharmaceutical products as radiation elements. The package 440 is for granular medicines. The package 445 is for tablet medicines. Each feeder circuit electromagnetically couples to the aluminum film 441 or 446 and an electromagnetic-coupling module 1 communicates with a reader/writer of an RFID system. In the twenty first preferred embodiment, by storing a manufacturing date, ingredients, an administration method, and a dosage method of the medicine in a radio IC chip, the electromagnetic-coupling module 1 not only is used for asset management and distribution management, but also enables identification of legal/illegal medicine on a package-by-package basis.

Twenty Second Preferred Embodiment

Figure 57:
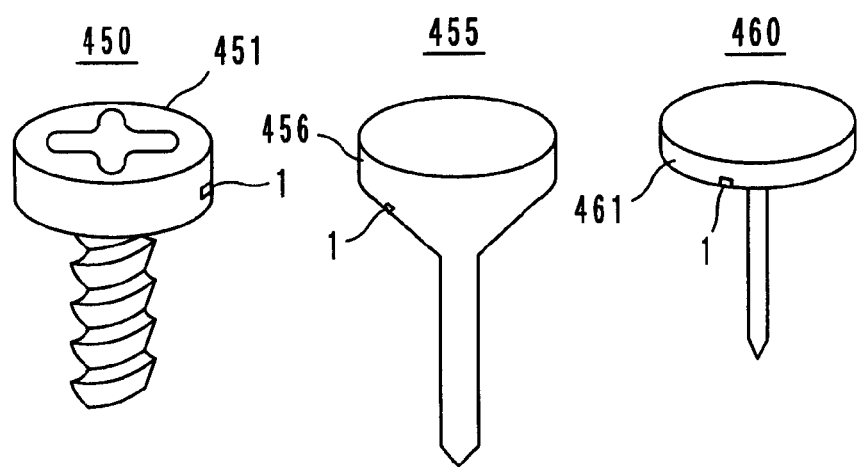
FIG. 57 is a perspective view showing a twenty second preferred embodiment of an electromagnetic-coupling-module-attached article according to the present invention.

As shown in FIG. 57, a twenty second preferred embodiment utilizes a metal screw 450, a nail 455, or a pin 460 as a radiation element. An electromagnetic-coupling module 1 is mounted on each of heads 451, 456, and 461. A feeder circuit electromagnetically couples to the screw 450, the nail 455, or the pin 460 and communicates with a reader/writer of an RFID system. In the twenty second preferred embodiment, the electromagnetic-coupling module 1 can be used for asset management of the screw 450 or other fastener. In addition, if the screw 450 requires precise construction such as in aircrafts, it is possible to manage the screw 450 by storing tightening torque, a construction date, a construction method, or the like in a radio IC chip.

Twenty Third Preferred Embodiment

Figure 58:
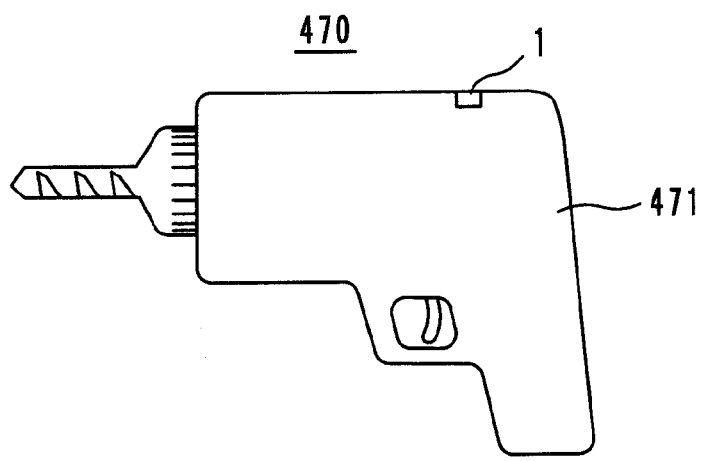
FIG. 58 is an elevational view showing a twenty third preferred embodiment of an electromagnetic-coupling-module-attached article according to the present invention.

As shown in FIG. 58, a twenty third preferred embodiment utilizes a metal casing 471 of an electric tool 470 as a radiation element. A feeder circuit of an electromagnetic-coupling module 1 electromagnetically couples to the casing 471 and the electromagnetic-coupling module 1 communicates with a reader/writer of an RFID system. In the twenty third preferred embodiment, the electromagnetic-coupling module 1 is used not only for asset management and distribution management of tools, such as the electric tool 470, but also for management in a tool box.

Twenty Fourth Preferred Embodiment

Figure 59:
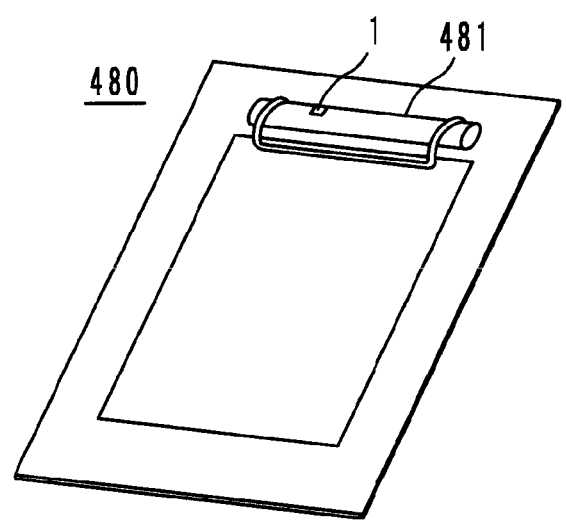
FIG. 59 is a perspective view showing a twenty fourth preferred embodiment of an electromagnetic-coupling-module-attached article according to the present invention.
Figure 60:
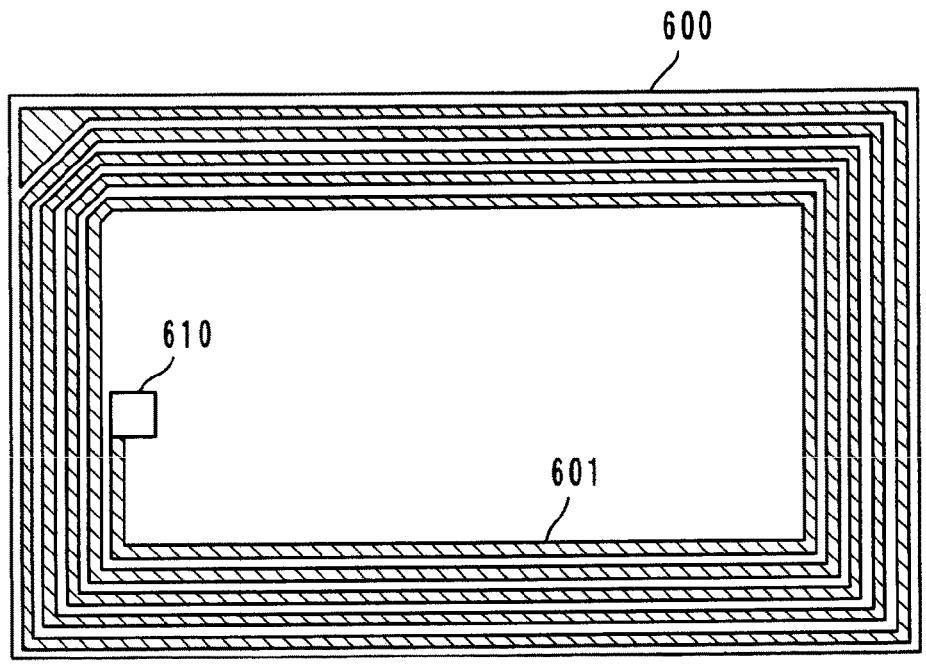
FIG. 60 is a plan view showing a first example of a conventional radio IC device.
Figure 61:
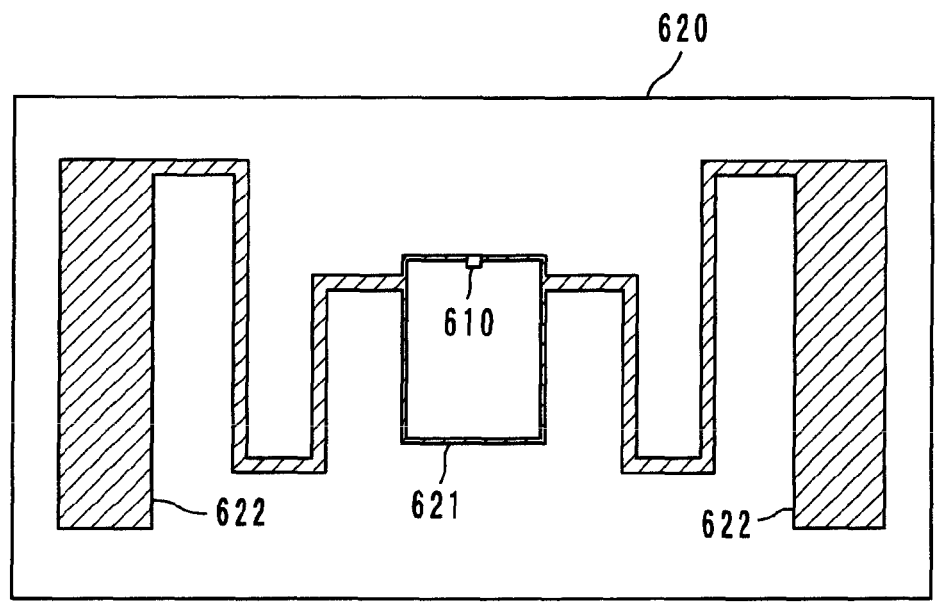
FIG. 61 is a plan view showing a second example of a conventional radio IC device.

As shown in FIG. 59, a twenty fourth preferred embodiment utilizes a metal portion 481 of a spring clipboard 480 as a radiation element. A feeder circuit of an electromagnetic-coupling module 1 is electromagnetically coupled to the metal portion 481 and the electromagnetic-coupling module 1 communicates with a reader/writer of an RFID system. In the twenty fourth preferred embodiment, the electromagnetic-coupling module 1 can be used not only for asset management and distribution management of office supplies, such as the spring clipboard 480, but also for storage management and storage position management in a cabinet by communication with an electromagnetic-coupling module 1 provided in the cabinet storing the clipboard 480.

Electromagnetic-coupling-module-attached articles according to the present invention are not limited to the above-described preferred embodiments, and can be modified within a sprit thereof.

In particular, articles to which electromagnetic-coupling modules are attached are not limited to those cited in the above-described preferred embodiments, and the electromagnetic-coupling modules can be attached to various kinds of articles. In addition, details of an internal configuration of a feeder circuit board and the specific shapes of a radiation element may be arbitrarily selected. Furthermore, a treatment other than solder bumps may be used for connecting a radio IC chip on a feeder circuit board.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. An article comprising:
a metal portion including at least one main surface; and
a power supply circuit including a coil-shaped electrode; wherein
the coil-shaped electrode of the power supply circuit is disposed adjacent to the at least one main surface of the metal portion such that a portion of the coil-shaped electrode overlaps the at least one main surface of the metal portion and another portion of the coil-shaped electrode does not overlap the at least one main surface of the metal portion when viewed in a direction perpendicular to the at least one main surface of the metal portion;

the coil-shaped electrode is disposed on only one side of the at least one main surface of the metal portion;

the coil-shaped electrode of the power supply circuit is magnetically coupled to the at least one main surface of the metal portion; and the metal portion is configured to perform at least one of transmitting a power supplied from the power supply circuit, and receiving a power and supplying the power to the power supply circuit.

2. The article according to claim 1, wherein metal portion is a housing of a mobile device.

3. The article according to claim 1, wherein the coil-shaped electrode is provided adjacent to an edge portion of the metal portion.

4. The article according to claim 3, wherein a winding axis of the coil-shaped electrode is substantially perpendicular to the metal portion.

5. The article according to claim 4, wherein the metal portion includes an opening, and the coil-shaped electrode is magnetically coupled to the opening.

* * * * *